(12) United States Patent
Byrne et al.

(10) Patent No.: US 9,337,358 B2
(45) Date of Patent: May 10, 2016

(54) PHOTOVOLTAIC CELL WITH BENZODITHIOPHENE-CONTAINING POLYMER

(75) Inventors: Paul Byrne, Morristown, PA (US); Kap-Soo Cheon, Shrewsbury, MA (US); Gilles Dennler, Tewksbury, MA (US); Nicolas Drolet, Tewsbury, MA (US); Serge Thompson, South Hampton, NH (US); David Waller, Lexington, MA (US); Li Wen, Woodbury, MN (US)

(73) Assignee: MERCK PATENT GMBH, Darmstadt, DE (US)

( * ) Notice: Subject to any disclaimer, the term of this patent is extended or adjusted under 35 U.S.C. 154(b) by 168 days.

(21) Appl. No.: 13/542,496

(22) Filed: Jul. 5, 2012

(65) Prior Publication Data

US 2014/0124035 A1    May 8, 2014

Related U.S. Application Data

(63) Continuation of application No. PCT/US2011/027722, filed on Jan. 5, 2011.

(60) Provisional application No. 61/292,315, filed on Jan. 5, 2010.

(51) Int. Cl.
*H01L 51/46* (2006.01)
*H01L 31/0216* (2014.01)
*C08G 61/12* (2006.01)
(Continued)

(52) U.S. Cl.
CPC ........ *H01L 31/02167* (2013.01); *C08G 61/123* (2013.01); *C08G 61/126* (2013.01); *H01L 51/0036* (2013.01); *H01L 51/0043* (2013.01); *C08G 2261/143* (2013.01); *C08G 2261/1426* (2013.01); *C08G 2261/1428* (2013.01); *C08G 2261/1452* (2013.01); *C08G 2261/3243* (2013.01); *C08G 2261/3246* (2013.01); *C08G 2261/414* (2013.01); *C08G 2261/416* (2013.01); *C08G 2261/91* (2013.01); *H01L 27/302* (2013.01); *H01L 51/4246* (2013.01); *H01L 51/4253* (2013.01); *Y02E 10/549* (2013.01)

(58) Field of Classification Search
CPC ............ H01L 51/0036; H01L 51/0043; H01L 51/0074; H01L 51/42; C08G 2261/3243; C08G 2261/91
USPC ........................................................ 136/263
See application file for complete search history.

(56) References Cited

U.S. PATENT DOCUMENTS

| | | | | |
|---|---|---|---|---|
| 8,304,512 | B2* | 11/2012 | Wigglesworth et al. | 528/377 |
| 2005/0082525 | A1* | 4/2005 | Heeney et al. | 257/40 |
| 2010/0078074 | A1* | 4/2010 | Yang et al. | 136/263 |

FOREIGN PATENT DOCUMENTS

EP    1524286 A1    4/2005

OTHER PUBLICATIONS

Chen, W-Y. et al.: "Polymer solar cells with enhanced open circuit voltage and efficiency", Nature Photonics, vol. 3, No. 11,Oct. 25, 2009, pp. 649-653, Nature Publishing Group.

(Continued)

*Primary Examiner* — Jayne Mershon
(74) *Attorney, Agent, or Firm* — Bowditch & Dewey, LLP; Roger P. Zimmerman

(57) ABSTRACT

Benzodithiophene-containing polymers, as well as related photovoltaic cells, articles, systems, and methods, are disclosed.

16 Claims, 3 Drawing Sheets

(51) Int. Cl.
 H01L 51/00  (2006.01)
 H01L 27/30  (2006.01)
 H01L 51/42  (2006.01)

(56) References Cited

OTHER PUBLICATIONS

Huo, L. et al.: "Improvement of Photoluminescent and Photovoltaic Properties of Poly(thienylene vinylene) by Carboxylate Substitution", Macromolecules, vol. 42, No. 13, Jun. 10, 2009, pp. 4377-4380.

Liangu., et al.: "Highly Efficient Solar Cell Potymers Developed via Fine-Tuning of Structural and Electronic Properties", Journal of the American Chemical Society, vol. 131, No. 22, May 19, 2009, pp. 7792-7799.

Xiao, S. et al: "Conjugated Polymers of Fused Bithiophenes with Enhanced pi-Electron Delocalization for Photovoltaic Applications", Macromolecules, American Chemical Society, US, vol. 41, No. 15, Jul. 12, 2008 pp. 5688-5696.

International Preliminary Report on Patentability in counterpart international application PCT/US2011/020227 dated Jul. 19, 2012.

"Carbonyl," Wikipedia, https://en.wikipedia.org/wiki/Carbonyl, visited May 11, 2015.

Hunt, I., and Spinney, R. 2006, "Organic Chemistry On-Line Learning Center," developed to support Carey, F. Organic Chemistry, McGraw-Hill, Chapter 12: "Reactions of Arenes. Electrophilic Aromatic Substitution. Substituent Effects, Table of Substituent Effects," http://www.chem.ucalgary.ca/courses/350/Carey5th/Carey.html, visited May 19, 2015.

"Methoxy," Wikipedia, https://en.wikipedia.org/wiki/Methoxy, visited May 8, 2015.

Roberts, J.D., and Caserio, M.C., Section 22-5, "Effect of Substituents on Reactivity and Orientation in Electrophilic Aromatic Substitution," pp. 1058-1064, in Chapter 22, "Arenes. Electrophilic Aromatic Substitution," in *Basic Principles of Organic Chemistry*, $2^{nd}$ Ed., W.A. Benjamin, Inc., Menlo Park, CA, 1977.

* cited by examiner

PHOTOVOLTAIC CELL WITH BENZODITHIOPHENE-CONTAINING POLYMER

CROSS REFERENCE TO RELATED APPLICATIONS

This application claims benefit of co-pending International Patent Application PCT/US2011/020227, filed Jan. 5, 2011, and U.S. Provisional Application Ser. No. 61/292,315, filed Jan. 5, 2010, the contents of both of which are hereby incorporated by reference.

TECHNICAL FIELD

This disclosure relates to benzodithiophene-containing polymers, as well as related photovoltaic cells, articles, systems, and methods.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material, thereby generating charge carriers (i.e., electrons and holes). As a result, the ability of the photoactive material to absorb light and general charge carriers can limit the overall efficiency of a photovoltaic cell.

SUMMARY

This disclosure is based on the unexpected discovery that a benzodithiophene-containing polymer possesses a lower highest occupied molecular orbital (HOMO) than a conventional photoactive polymer. As a result, such a polymer can be used to prepare a photovoltaic cell with an improved open circuit voltage ($V_{oc}$) and therefore improved energy conversion efficiency.

In one aspect, this disclosure features a polymer that includes a first monomer repeat unit containing a benzodithiophene moiety substituted with at least one electron withdrawing group.

In another aspect, this disclosure features a polymer that includes first and second monomer repeat units, the first monomer repeat unit containing a benzodithiophene moiety and the second monomer repeat unit containing a thiazolothiazole moiety.

In still another aspect, this disclosure features an article that includes a first electrode, a second electrode, and a photoactive material disposed between the first and second electrodes. The photoactive material includes one or more of the benzodithiophene-containing polymers described above. The article is configured as a photovoltaic cell.

Features and advantages of the polymers and photovoltaic cells described in this disclosure will be apparent from the description and drawings and the claims.

DESCRIPTION OF DRAWINGS

Like reference symbols in the various drawings indicate like elements.

DETAILED DESCRIPTION

Figure 1:
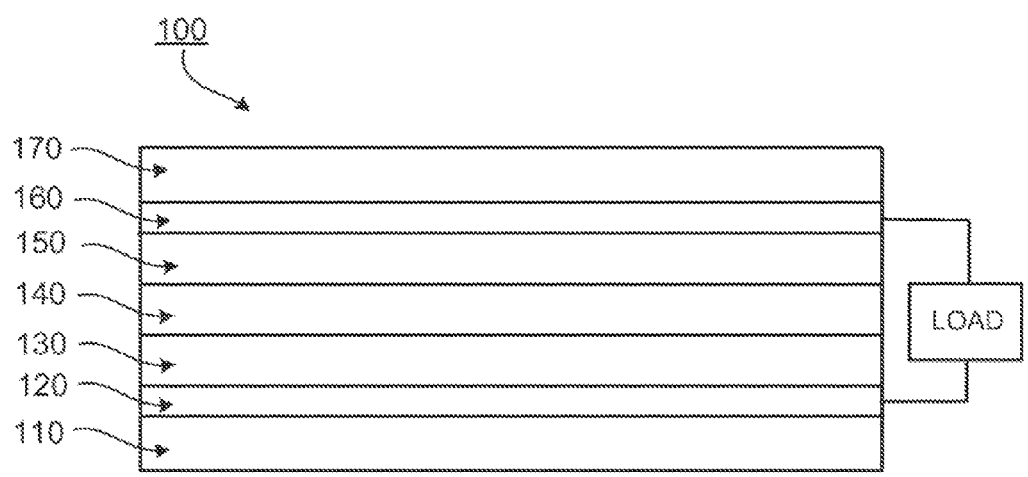
FIG. 1 is a cross-sectional view of an embodiment of a photovoltaic cell.

FIG. 1 shows a cross-sectional view of a photovoltaic cell 100 that includes a substrate 110, an electrode 120, an optional hole blocking layer 130, a photoactive layer 140 (e.g., containing an electron acceptor material and an electron donor material), a hole carrier layer 150, an electrode 160, and a substrate 170.

In general, during use, light can impinge on the surface of substrate 110, and passes through substrate 110, electrode 120, and optional hole blocking layer 130. The light then interacts with photoactive layer 140, causing electrons to be transferred from the electron donor material (e.g., a benzodithiophene-containing polymer) to the electron acceptor material (e.g., a substituted fullerene). The electron acceptor material then transmits the electrons through optional hole blocking layer 130 to electrode 120, and the electron donor material transfers holes through hole carrier layer 150 to electrode 160. Electrodes 120 and 160 are in electrical connection via an external load so that electrons pass from electrode 120 through the load to electrode 160.

In some embodiments, the electron donor or acceptor material can include one or more polymers (e.g., homopolymers or copolymers). A polymer mentioned herein includes at least two identical or different monomer repeat units (e.g., at least 5 monomer repeat units, at least 10 monomer repeat units, at least 50 monomer repeat units, at least 100 monomer repeat units, or at least 500 monomer repeat units). A homopolymer mentioned herein refers to a polymer that includes monomer repeat units with the same chemical structure. A copolymer mentioned herein refers to a polymer that includes at least two (e.g., three or four) monomer repeat units with different chemical structures. In general, the polymers suitable for use as electron donor or acceptor materials are photovoltaically active.

In some embodiments, the electron donor or acceptor material can include one or more of the following monomer repeat units: a benzodithiophene moiety, a cyclopentadithiazole moiety, a benzothiadiazole moiety, a thiadiazoloquinoxaline moiety, a benzoisothiazole moiety, a benzothiazole moiety, a dithienopyrrole moiety, a dibenzosilole moiety, a thienothiophene moiety, a carbazole moiety, a dithienothiophene moiety, a tetrahydroisoindole moiety, a fluorene moiety, a silole moiety, a cyclopentadithiophene moiety, a thiazole moiety, a selenophene moiety, a thiazolothiazole moiety, a naphthothiadiazole moiety, a thienopyrazine moiety, a silacyclopentadithiophene moiety, a thiophene moiety, an oxazole moiety, an imidazole moiety, a pyrimidine moiety, a benzoxazole moiety, a benzimidazole moiety, a quinoxaline moiety, a pyridopyrazine moiety, a pyrazinopyridazine moiety, a pyrazinoquinoxaline moiety, a thiadiazolopyridine moiety, a thiadiazolopyridazine moiety, a benzooxadiazole moiety, an oxadiazolopyridine moiety, an oxadiazolopyridazine moiety, a benzoselenadiazole moiety, a benzobisoxazole moiety, a thienothiadiazole moiety, a thienopyrroledione moiety, or a tetrazine moiety.

For example, the electron donor or acceptor material can include one or more of the following monomer repeat units: a benzodithiophene moiety of formula (1), a benzodithiophene moiety of formula (2), a cyclopentadithiazole moiety of formula (3), a benzothiadiazole moiety of formula (4), a thiadiazoloquinoxaline moiety of formula (5), a benzoisothiazole moiety of formula (6), a benzothiazole moiety of formula (7), a dithienopyrrole moiety of formula (8), a dibenzosilole moiety of formula (9), a thienothiophene moiety of formula (10), a thienothiophene moiety of formula (11), a carbazole moiety of formula (12), a dithienothiophene moiety of formula (13), a tetrahydroisoindole moiety of formula (14), a fluorene moiety of formula (15), a silole moiety of formula (16), a cyclopentadithiophene moiety of formula (17), a thiazole moiety of formula (18), a selenophene moiety of formula (19), a thiazolothiazole moiety of formula (20), a naphthothiadiazole moiety of formula (21), a thienopyrazine moiety of formula (22), a silacyclopentadithiophene moiety of formula (23), a thiophene moiety of formula (24), an oxazole moiety of formula (25), an imidazole moiety of formula (26), a pyrimidine moiety of formula (27), a benzoxazole moiety of formula (28), a benzimidazole moiety of formula (29), a quinoxaline moiety of formula (30), a pyridopyrazine moiety of formula (31), a pyrazinopyridazine moiety of formula (32), a pyrazinoquinoxaline moiety of formula (33), a thiadiazolopyridine moiety of formula (34), a thiadiazolopyridazine moiety of formula (35), a benzooxadiazole moiety of formula (36), an oxadiazolopyridine moiety of formula (37), an oxadiazolopyridazine moiety of formula (38), a benzoselenadiazole moiety of formula (39), a benzobisoxazole moiety of formula (40), a benzobisoxazole moiety of formula (41), a thienothiadiazole moiety of formula (42), a thienopyrroledione moiety of formula (43), or a tetrazine moiety of formula (44):

(1)

(2)

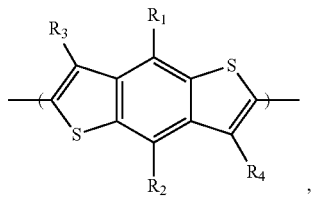

(3)

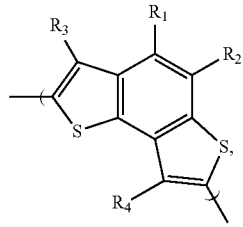

(4)

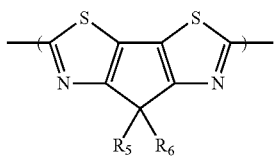

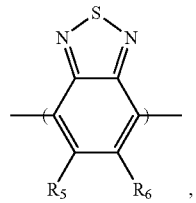

(5)

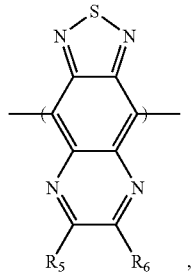

(6)

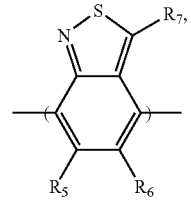

(7)

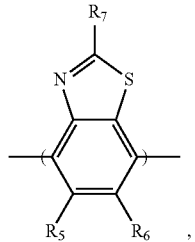

(8)

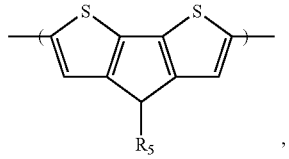

(9)

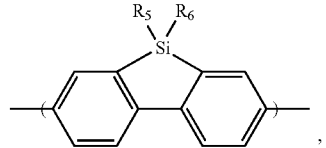

(10)

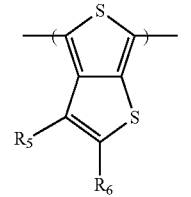

(11)

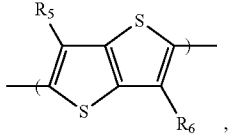

(12)

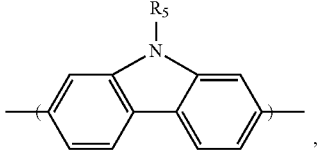

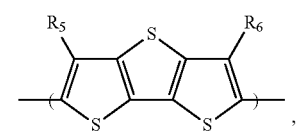 (13)
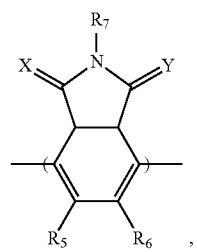 (14)
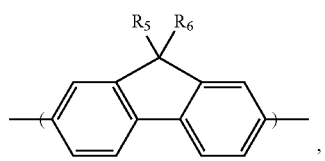 (15)
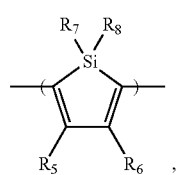 (16)
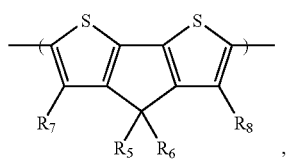 (17)
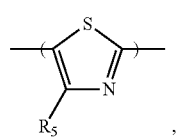 (18)
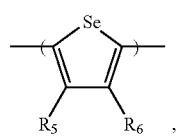 (19)
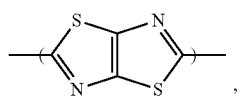 (20)
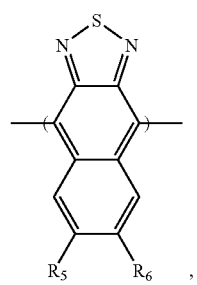 (21)
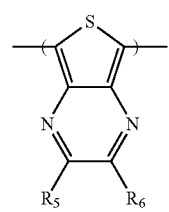 (22)
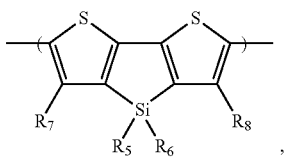 (23)
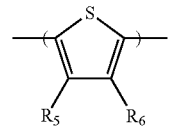 (24)
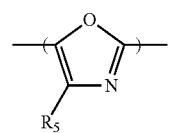 (25)
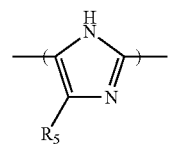 (26)
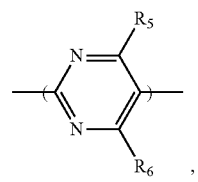 (27)
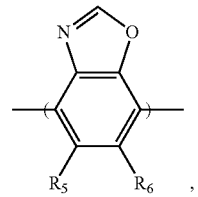 (28)
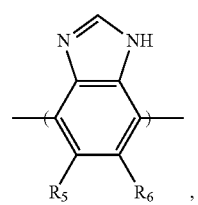 (29)

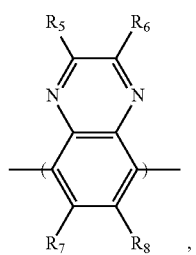
(30)
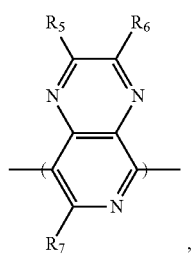
(31)
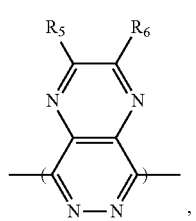
(32)
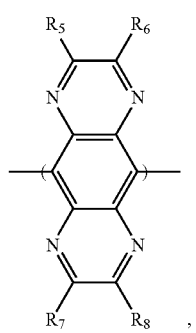
(33)
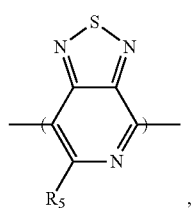
(34)
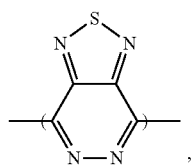
(35)
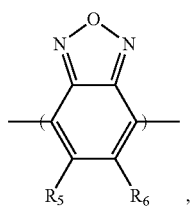
(36)
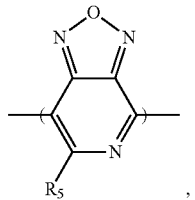
(37)
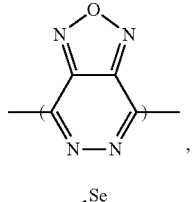
(38)
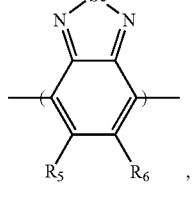
(39)
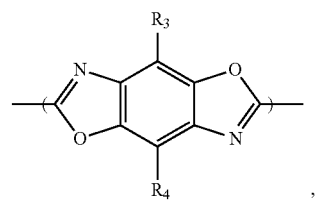
(40)
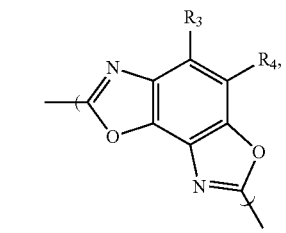
(41)
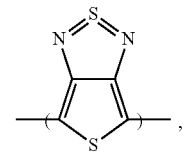
(42)
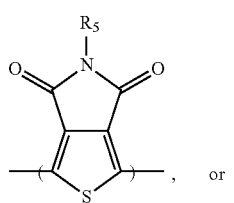, or
(43)

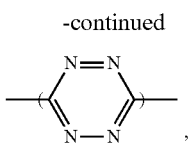
(44)

in which each of X and Y, independently, is CH$_2$, O, or S; each of R$_1$ and R$_2$, independently, COR, COOR, CO—N(RR'), C$_1$-C$_{20}$ perfluoroalkyl, CN, or SO$_3$R, in which each of R or R', independently, is H, C$_1$-C$_{24}$ alkyl, aryl, heteroaryl, C$_3$-C$_{24}$ cycloalkyl, or C$_3$-C$_{24}$ heterocycloalkyl; and each of R$_3$, R$_4$, R$_5$, R$_6$, R$_7$, and R$_8$, independently, is H, halo (e.g., F, Cl, Br, or I), C$_1$-C$_{24}$ alkyl, C$_1$-C$_{24}$ alkoxy, aryl, heteroaryl, C$_3$-C$_{24}$ cycloalkyl, C$_3$-C$_{24}$ heterocycloalkyl, COR", or COOR", in which R" is H, C$_1$-C$_{24}$ alkyl, aryl, heteroaryl, cycloalkyl, or C$_3$-C$_{24}$ heterocycloalkyl.

An alkyl can be saturated or unsaturated and branched or straight chained. A C$_1$-C$_{24}$ alkyl contains any of 1 to 24 carbon atoms. Examples of alkyl moieties include —CH$_3$, —CH$_2$=CH$_2$—, —CH$_2$—CH=CH$_2$, and branched —C$_3$H$_7$. An alkoxy can be branched or straight chained and saturated or unsaturated. A C$_1$-C$_{24}$ alkoxy contains an oxygen radical and any of 1 to 24 carbon atoms. Examples of alkoxy moieties include —OCH$_3$ and —OCH=CH—CH$_3$. A cycloalkyl can be either saturated or unsaturated and can contain one or more (e.g., two, three, four, or five) rings. A C$_3$-C$_{24}$ cycloalkyl contains any of 3 to 24 carbon atoms. Examples of cycloalkyl moieties include cyclohexyl and cyclohexen-3-yl. A heterocycloalkyl can also be either saturated or unsaturated and can contain one or more (e.g., two, three, four, or five) rings. A C$_3$-C$_{24}$ heterocycloalkyl contains at least one ring heteroatom (e.g., O, N, and S) and any of 3 to 24 carbon atoms. Examples of heterocycloalkyl moieties include 4-tetrahydropyranyl and 4-pyranyl. An aryl can contain one or more (e.g., two, three, four, or five) aromatic rings. Examples of aryl moieties include phenyl, phenylene, naphthyl, naphthylene, pyrenyl, anthryl, and phenanthryl. A heteroaryl can contain one or more (e.g., two, three, four, or five) aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include C$_1$-C$_{20}$ alkyl, C$_3$-C$_{20}$ cycloalkyl, C$_1$-C$_{20}$ alkoxy, aryl, aryloxy, heteroaryl, heteroaryloxy, amino, C$_1$-C$_{10}$ alkylamino, C$_1$-C$_{20}$ dialkylamino, arylamino, diarylamino, hydroxyl, halogen, thio, C$_1$-C$_{10}$ alkylthio, arylthio, C$_1$-C$_{10}$ alkylsulfonyl, arylsulfonyl, cyano, nitro, acyl, acyloxy, carboxyl, and carboxylic ester. Examples of substituents on alkyl include all of the above-recited substituents except C$_1$-C$_{20}$ alkyl. Cycloalkyl, heterocycloalkyl, aryl, and heteroaryl also include fused groups.

In some embodiments, the electron donor or acceptor material can be a homopolymer. In some embodiments, the electron donor or acceptor material can be copolymer that includes a first monomer repeat unit and a second monomer repeat unit different from the first monomer repeat unit. In such embodiments, the copolymer optionally further includes a third monomer repeat unit different from the first and second monomer repeat units.

In some embodiments, the electron donor material can include a polymer that includes a first monomer repeat unit containing a benzodithiophene moiety (e.g., a benzodithiophene moiety substituted with at least one electron withdrawing group). Without wishing to be bound by theory, it is believed that a benzodithiophene-containing polymer (e.g., a polymer containing a benzodithiophene moiety substituted with at least one electron withdrawing group) possesses a lower HOMO than a conventional photoactive polymer. As a result, such a polymer can be used to prepare a photovoltaic cell with an improved V$_{oc}$ and therefore improved energy conversion efficiency. In addition, a benzodithiophene-containing polymer (e.g., a polymer containing a benzodithiophene moiety substituted with at least one electron withdrawing group) can exhibit a lower lowest unoccupied molecular orbital (LUMO), improved hole mobility, and improved fill factor compared to a conventional photoactive polymer. Without wishing to be bound by theory, it is believed that such a polymer can be used to prepare a photoactive layer with a sufficiently large thickness (e.g., at least about 150 nm, at least about 200 nm, at least about 250 nm, or at least about 300 nm) while still maintaining a sufficiently high fill factor. A photoactive layer with such a thickness can be readily prepared by using a continuous roll-to-roll process, thereby reducing the manufacturing costs of a photovoltaic cell.

In some embodiments, the first monomer repeat unit in the electron donor material can include a benzodithiophene moiety substituted with at least one electron withdrawing group (e.g., at least two electron withdrawing groups). The electron withdrawing group can be COR, COOR, CO—N(RR'), C$_1$-C$_{20}$ perfluoroalkyl, CN, or SO$_3$R, in which each of R or R', independently, is H, C$_1$-C$_{24}$ alkyl, aryl, heteroaryl, C$_3$-C$_{24}$ cycloalkyl, or C$_3$-C$_{24}$ heterocycloalkyl. For example, the electron withdrawing group can be COOC$_8$H$_{17}$, COOC$_{10}$H$_{21}$, COOC$_{12}$H$_{25}$, COOC$_{14}$H$_{29}$, COOC$_{16}$H$_{33}$, CO—N(C$_4$H$_9$)$_2$, or CO—N(C$_8$H$_{17}$)$_2$.

In some embodiments, the first monomer repeat unit in the electron donor material can include a benzodithiophene moiety of formula (1) or (2):

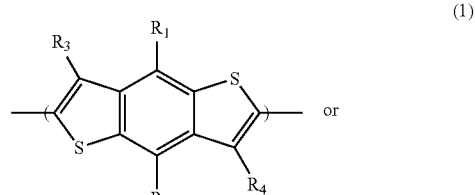
(1)

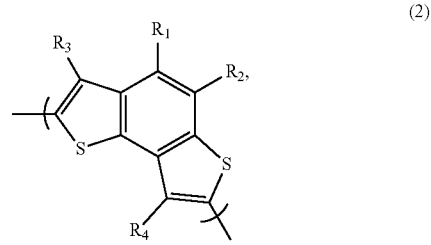
(2)

in which each of R$_1$ and R$_2$, independently, is H or an electron withdrawing group, and each of R$_3$ and R$_4$, independently, is H, halo, C$_1$-C$_{24}$ alkyl, C$_1$-C$_{24}$ alkoxy, aryl, heteroaryl, C$_3$-C$_{24}$ cycloalkyl, C$_3$-C$_{24}$ heterocycloalkyl, COR", or COOR", in which R" is H, C$_1$-C$_{24}$ alkyl, aryl, heteroaryl, C$_3$-C$_{24}$ cycloalkyl, or C$_3$-C$_{24}$ heterocycloalkyl. The electron withdrawing group can be those defined above. In such embodiments, the second or third monomer repeat unit in the copolymer can include any of the moieties of formula (2)-(42) described above. For example, the second monomer repeat unit can include a benzothiadiazole moiety (e.g., the moiety of formula (4)), a thienothiophene moiety (e.g., the moiety of formula (10)), a thiazolothiazole moiety (e.g., the moiety of formula (20)), a thienopyrazine moiety (e.g., the moiety of formula (22)), a pyrazinopyridazine moiety (e.g., the moiety of formula (32)), or a thienothiadiazole moiety (e.g., the moiety of formula (42)). As another example, the optional third monomer repeat unit can include a thiazole moiety or a thiophene moiety. For example, the optional third monomer repeat unit can include a thiazole moiety of formula (18) or a thiophene moiety of formula (24):

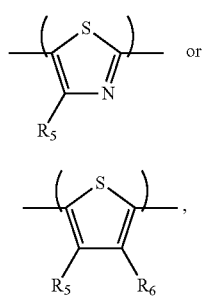

in which each of $R_5$ and $R_6$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, COR", or COOR", in which R" is H, $C_1$-$C_{24}$ alkyl, aryl, heteroaryl, $C_3$-$C_{24}$ cycloalkyl, or $C_3$-$C_{24}$ heterocycloalkyl. In such embodiments, $R_5$ can be H, $C_1$-$C_{24}$ alkyl (e.g., $C_6H_{13}$, $C_8H_{17}$, or $C_{14}H_{29}$), COR" (e.g., $COC_{13}H_{27}$), or COOR" (e.g., $COOC_6H_{13}$ or $COOC_{14}H_{29}$), and $R_6$ is H or halo (e.g., Cl).

In some embodiments, the electron donor material can include a copolymer containing first and second monomer repeat units, in which the first monomer repeat unit contains a benzodithiophene moiety (e.g., the moiety of formula (1) or (2)) and the second monomer repeat unit contains a thiazolothiazole moiety (e.g., the moiety of formula (20)). In such embodiments, the benzodithiophene moiety can be substituted with at least one (e.g., at least two) OR, in which R is $C_1$-$C_{24}$ alkyl (e.g., 2-ethylhexyl), $C_1$-$C_{24}$ alkoxy, aryl, heteroaryl, $C_3$-$C_{24}$ cycloalkyl, or $C_3$-$C_{24}$ heterocycloalkyl. For example, the first monomer repeat unit can include a benzodithiophene moiety of formula (1) or (2), in which each of $R_1$ and $R_2$, independently, is H or OR, and each of $R_3$ and $R_4$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, COR", or COOR", R being defined above and R" being H, $C_1$-$C_{24}$ alkyl, aryl, heteroaryl, $C_3$-$C_{24}$ cycloalkyl, or $C_3$-$C_{24}$ heterocycloalkyl.

The copolymer described in the preceding paragraph can also include an optional third monomer repeat unit different from the first and second monomer repeat units. For example, the optional third monomer repeat unit can include a thiophene moiety, such as a thiophene moiety of formula (24),

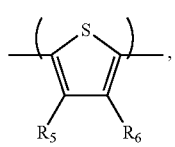

in which each of $R_5$ and $R_6$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, COR", or COOR", in which R" is H, $C_1$-$C_{24}$ alkyl, aryl, heteroaryl, $C_3$-$C_{24}$ cycloalkyl, or $C_3$-$C_{24}$ heterocycloalkyl. In such embodiments, $R_5$ can be $C_1$-$C_{24}$ alkyl (e.g., $C_{14}H_{29}$) or COOR" (e.g., $COOC_6H_{13}$ or $COOC_{14}H_{29}$), and $R_6$ is H or halo (e.g., Cl).

In some embodiments, the first, second, or third monomer repeat unit can be substituted with a group containing a long alkyl chain (e.g., $C_8$-$C_{24}$ alkyl). Without wishing to be bound by theory, it is believed that a monomer repeat unit containing a substituent with a long, alkyl chain can result in a polymer with a high solubility in a solvent (e.g., an organic solvent). As a result, such a polymer can have an improved processability and therefore can be used readily to prepare a photoactive layer.

In general, the molar ratio of the first, second, and optional third monomer repeat to units in a copolymer that is used as an electron donor or acceptor material can vary as desired. In some embodiments, the molar ratio of the first or third monomer repeat unit to the second monomer repeat units is at least about 1:1 (e.g., at least about 2:1, at least about 3:1, or at least 4:1) and/or at most about 10:1 (e.g., at most about 5:1, at most about 4:1, at most about 3:1, or at most about 2:1). For example, a copolymer containing three monomer repeat units can have the first, second, and third monomer repeat units in a molar ratio of about 1:1:2.

In some embodiments, the copolymer can contain two different monomer repeat units, in which the first monomer repeat unit is a benzodithiophene moiety of formula (1) or (2) and the second monomer repeat unit is any of the moieties of formula (1)-(42). In such embodiments, the copolymer can contain any of 1-100 first and second monomer repeat units. Examples of such copolymers include

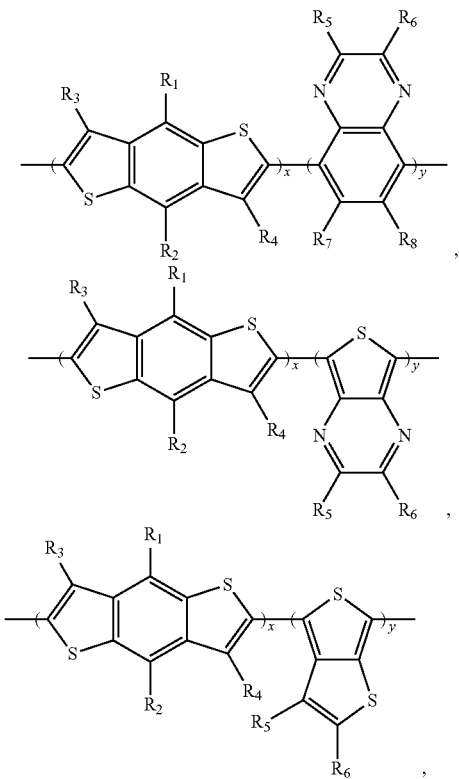

-continued

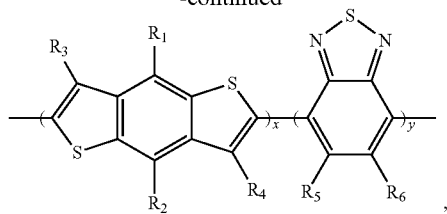

in which $R_1$-$R_8$ are defined above and each of x and y, independently, can be any integer ranging from 1-100.

In some embodiments, the copolymer can contain three different monomer repeat units, in which the first monomer repeat unit is a benzodithiophene moiety of formula (1) or (2), the second monomer repeat unit is any of the moieties of formula (1)-(42), and the third monomer repeat unit is any of the moieties of formula (1)-(42). In such embodiments, the copolymer can contain any of 1-100 first, second, and third monomer repeat units. Examples of such copolymers include

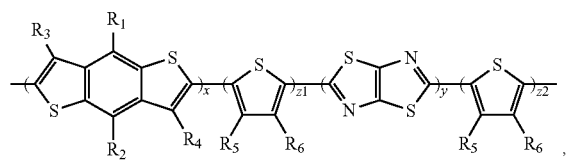

-continued

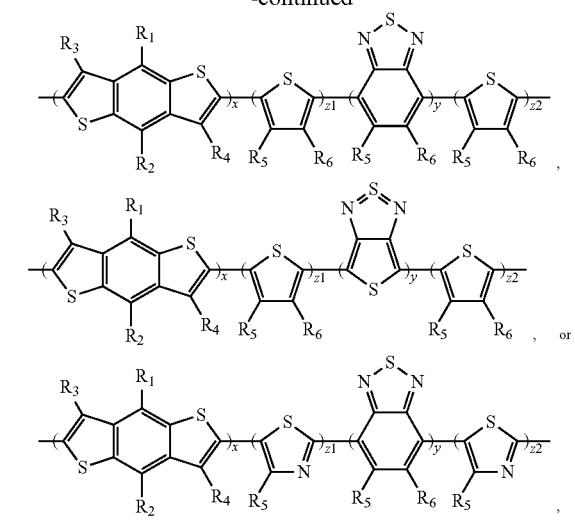

in which $R_1$-$R_6$ are defined above and each of x, y, z1, and z2, independently, can be any integer ranging from 1-100.

Exemplary electron donor materials that can be used in photoactive layer 140 include polymers 1-24 listed below:

Polymer 1

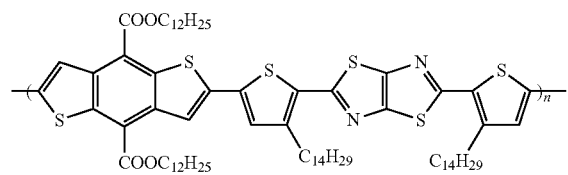

Polymer 2

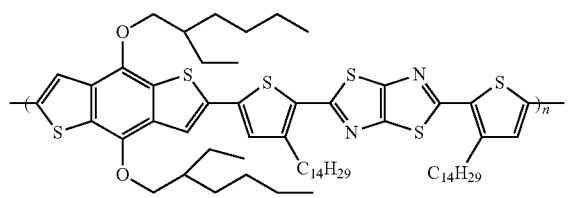

Polymer 3

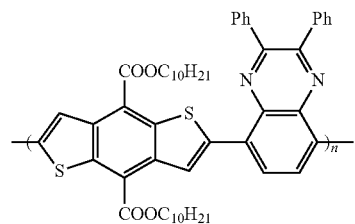

Polymer 4

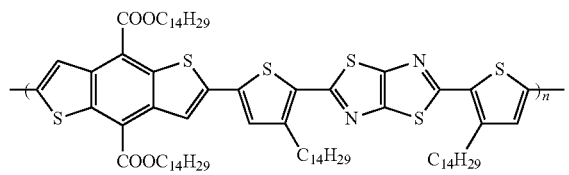

Polymer 5

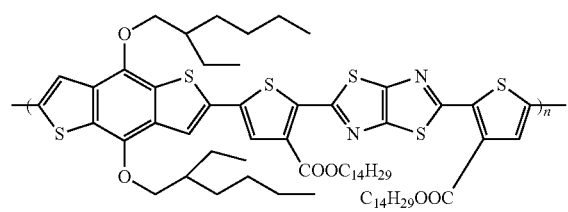

Polymer 6

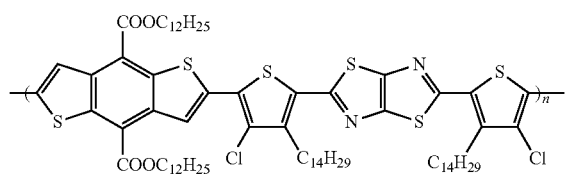

-continued
Polymer 7
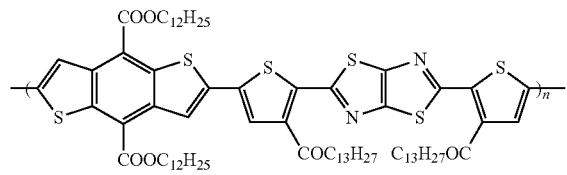
Polymer 8
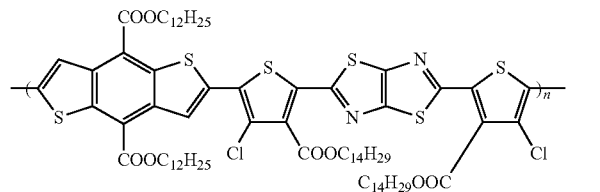
Polymer 9
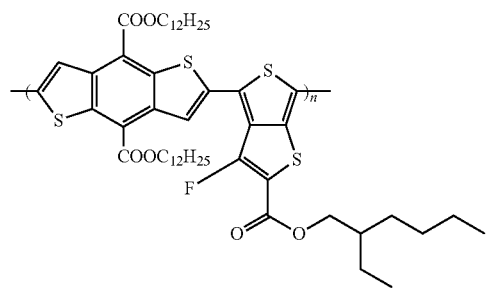
Polymer 10
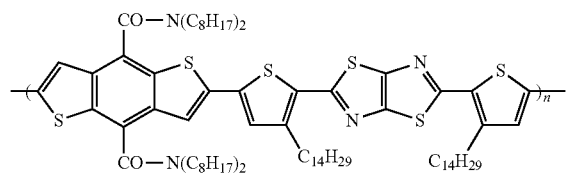
Polymer 11
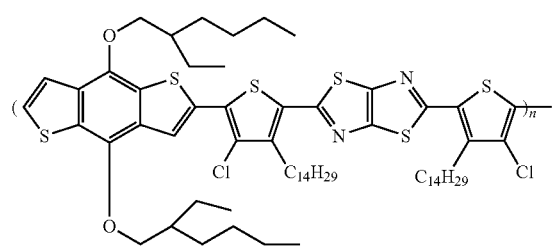
Polymer 12
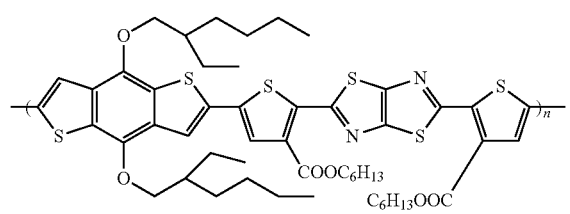
Polymer 13
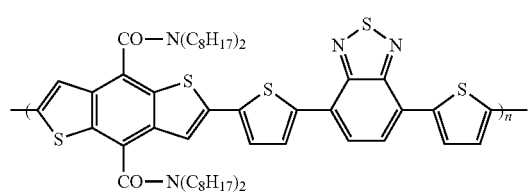
Polymer 14
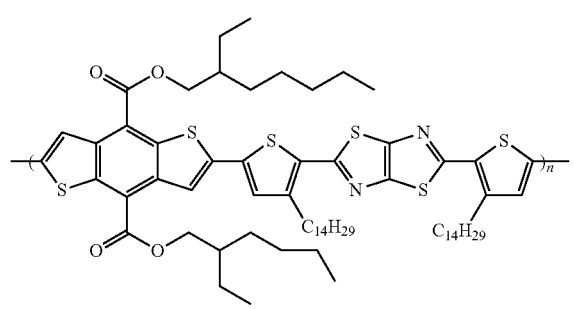
Polymer 15
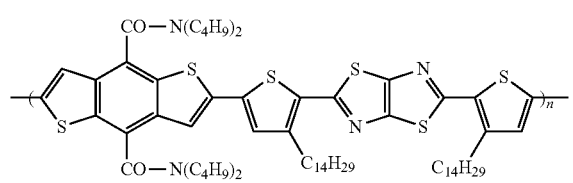
Polymer 16
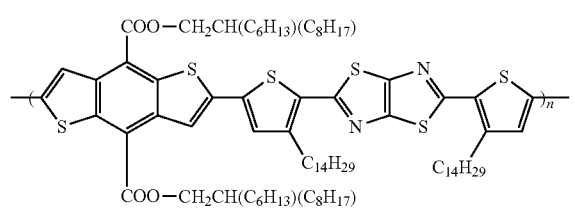
Polymer 17
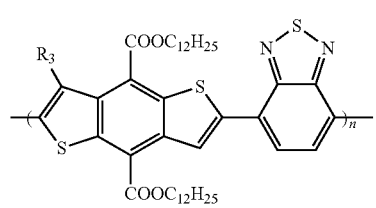
Polymer 18
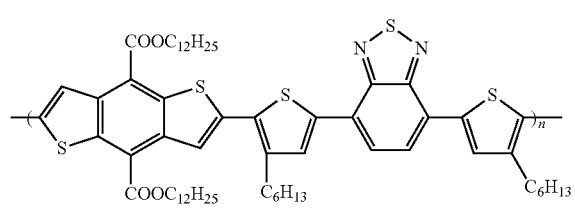

Polymer 19
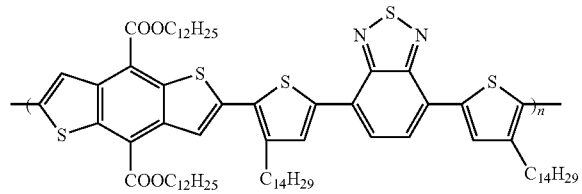

Polymer 20
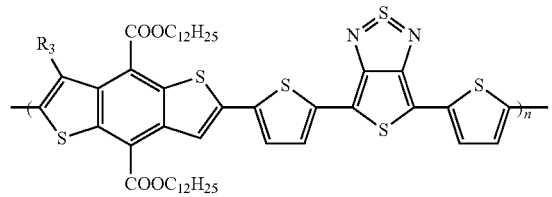

Polymer 21
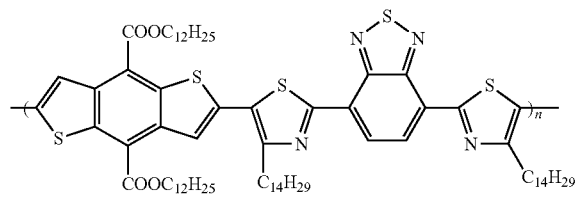

Polymer 22
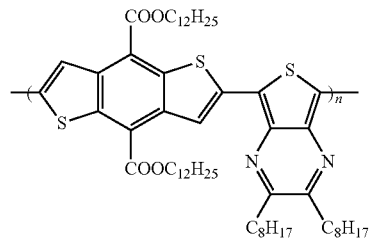

Polymer 23
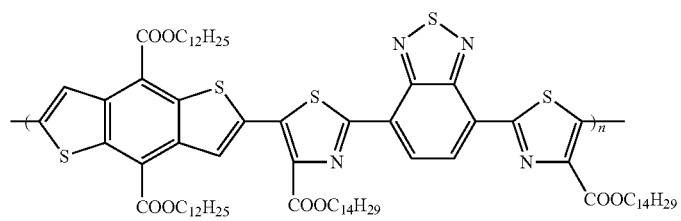

Polymer 24
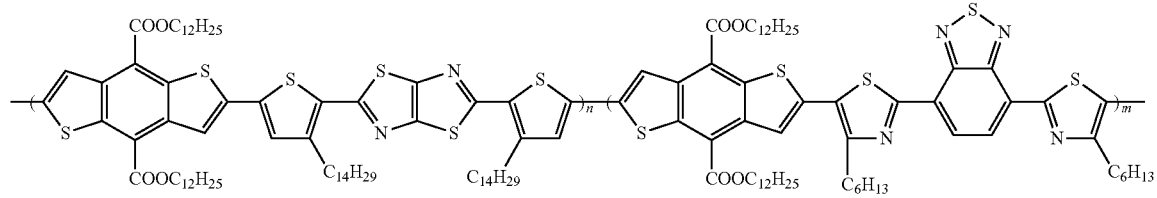

In the above formulas, each of n and m, independently, can be any integer ranging from 2-100.

Without wishing to be bound by theory, it is believed that a photovoltaic cell having a benzodithiophene-containing polymer described above (e.g., a polymer containing the first, second, and optional third monomer repeat units described above) can have a high energy conversion efficiency. In some embodiments, such a photovoltaic cell can have an efficiency of at least about 4% (e.g., at least about 5%, at least about 6%, or at least about 7%) under AM 1.5 conditions. Further, without wishing to be bound by theory, it is believed that other advantages of the polymers described above include suitable band gap (e.g., 1.4-1.6 eV) that can improve photocurrent and cell voltage, high positive charge mobility (e.g., $10^{-4}$ to $10^{-1}$ cm$^2$/Vs) that can facilitate charge separation in photoactive layer 140, and high solubility in an organic solvent that can improve film forming ability and processability. In some embodiments, the polymers can be optically non-scattering.

The photoactive polymers described above can be prepared by methods known in the art. For example, a copolymer can be prepared by a cross-coupling reaction between one or more monomers containing two organometallic groups (e.g., alkylstannyl groups, Grignard groups, or alkylzinc groups) and one or more monomers containing two halo groups (e.g., Cl, Br, or I) in the presence of a transition metal catalyst. As another example, a copolymer can be prepared by a cross-coupling reaction between one or more monomers containing two borate groups and one or more monomers containing two halo groups (e.g., Cl, Br, or I) in the presence of a transition metal catalyst. Other methods that can be used to prepare the copolymers described above including Suzuki coupling reactions, Negishi coupling reactions, Kumada coupling reactions, and Stille coupling reactions, all of which are well known in the art. Examples 1-24 below provide descriptions of how polymers 1-23 listed above were actually prepared.

The monomers can be prepared by the methods described herein or by the methods know in the art, such as those described in U.S. patent application Ser. No. 11/486,536, Coppo et al., *Macromolecules* 2003, 36, 2705-2711, Kurt et al., *J. Heterocycl. Chem.* 1970, 6, 629, Chen et al., *J. Am. Chem. Soc.*, (2006) 128(34), 10992-10993, Hou et al., *Macromolecules* (2004), 37, 6299-6305, and Bijleveld et al., *Adv. Funct. Mater.*, (2009), 19, 3262-3270. The monomers can contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

In some embodiments, electron acceptor materials of photoactive layer 140 can include fullerenes. In some embodiments, photoactive layer 140 can include one or more unsubstituted fullerenes and/or one or more substituted fullerenes.

Examples of unsubstituted fullerenes include $C_{50}$, $C_{70}$, $C_{76}$, $C_{75}$, $C_{82}$, $C_{84}$, and $C_{92}$. Examples of substituted fullerenes include fullerene substituted with phenyl-butyric acid methyl esters (PCBMs, such as C61-PCBM and C71-PCBM) or fullerenes substituted with $C_1$-$C_{20}$ alkoxy optionally further substituted with $C_1$-$C_{20}$ alkoxy and/or halo (e.g., $(OCH_2CH_2)_2OCH_3$ or $OCH_2CF_2OCF_2CF_2OCF_3$). Without wishing to be bound by theory, it is believed that fullerenes substituted with long-chain alkoxy groups (e.g., oligomeric ethylene oxides) or fluorinated alkoxy groups have improved solubility in organic solvents and can form a photoactive layer with improved morphology. Other examples of fullerenes have been described in, e.g., commonly-owned co-pending U.S. Application Publication No. 2005-0279399. In some embodiments, the electron acceptor material can include one or more of the photoactive polymers described above. In certain embodiments, a combination of electron acceptor materials (e.g., a fullerene and a photoactive polymer described above) can be used in photoactive layer 140.

Turning to other components of photovoltaic cell 100, substrate 110 is generally formed of a transparent material. As referred to herein, a transparent material is a material which, at the thickness used in a photovoltaic cell 100, transmits at least about 60% (e.g., at least about 70%, at least about 75%, at least about 80%, at least about 85%) of incident light at a wavelength or a range of wavelengths used during operation of the photovoltaic cell. Exemplary materials from which substrate 110 can be formed include polyethylene terephthalates, polyimides, polyethylene naphthalates, polymeric hydrocarbons, cellulosic polymers, polycarbonates, polyamides, polyethers, and polyether ketones. In certain embodiments, the polymer can be a fluorinated polymer. In some embodiments, combinations of polymeric materials are used. In certain embodiments, different regions of substrate 110 can be formed of different materials.

In general, substrate 110 can be flexible, semi-rigid or rigid (e.g., glass). In some embodiments, substrate 110 has a flexural modulus of less than about 5,000 megaPascals (e.g., less than about 1,000 megaPascals or less than about 500 megaPascals). In certain embodiments, different regions of substrate 110 can be flexible, semi-rigid, or inflexible (e.g., one or more regions flexible and one or more different regions semi-rigid, one or more regions flexible and one or more different regions inflexible).

Typically, substrate 110 is at least about one micron (e.g., at least about five microns or at least about 10 microns) thick and/or at most about 1,000 microns (e.g., at most about 500 microns thick, at most about 300 microns thick, at most about 200 microns thick, at most about 100 microns, or at most about 50 microns) thick.

Generally, substrate 110 can be colored or non-colored. In some embodiments, one or more portions of substrate 110 is/are colored while one or more different portions of substrate 110 is/are non-colored.

Substrate 110 can have one planar surface (e.g., the surface on which light impinges), two planar surfaces (e.g., the surface on which light impinges and the opposite surface), or no planar surfaces. A non-planar surface of substrate 110 can, for example, be curved or stepped. In some embodiments, a non-planar surface of substrate 110 is patterned (e.g., having patterned steps to form a Fresnel lens, a lenticular lens or a lenticular prism).

Electrode 120 is generally formed of an electrically conductive material. Exemplary electrically conductive materials include electrically conductive metals, electrically conductive alloys, electrically conductive polymers, and electrically conductive metal oxides. Exemplary electrically conductive metals include gold, silver, copper, aluminum, nickel, palladium, platinum, and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum, and alloys of titanium. Exemplary electrically conducting polymers include polythiophenes (e.g., doped poly(3,4-ethylenedioxythiophene) (doped PEDOT)), polyanilines (e.g., doped polyanilines), polypyrroles (e.g., doped polypyrroles). Exemplary electrically conducting metal oxides include indium tin oxide, fluorinated tin oxide, tin oxide and zinc oxide. In some embodiments, combinations of electrically conductive materials are used.

In some embodiments, electrode 120 can include a mesh electrode. Examples of mesh electrodes are described in co-pending U.S. Patent Application Publication Nos. 20040187911 and 20060090791.

In some embodiments, a combination of the materials described above can be used to form electrode 120.

Optionally, photovoltaic cell 100 can include a hole blocking layer 130. The hole blocking layer is generally formed of a material that, at the thickness used in photovoltaic cell 100, transports electrons to electrode 120 and substantially blocks the transport of holes to electrode 120. Examples of materials from which the hole blocking layer can be formed include LiF, metal oxides (e.g., zinc oxide, titanium oxide), and amines (e.g., primary, secondary, or tertiary amines). Examples of amines suitable for use in a hole blocking layer have been described, for example, in co-pending U.S. Application Publication No. 2008-0264488.

Without wishing to be bound by theory, it is believed that when photovoltaic cell 100 includes a hole blocking layer made of amines, the hole blocking layer can facilitate the formation of ohmic contact between photoactive layer 140 and electrode 120 without being exposed to UV light, thereby reducing damage to photovoltaic cell 100 resulted from UV exposure.

Typically, hole blocking layer 130 is at least about 0.02 micron (e.g., at least about 0.03 micron, at least about 0.04 micron, or at least about 0.05 micron) thick and/or at most about 0.5 micron (e.g., at most about 0.4 micron, at most about 0.3 micron, at most about 0.2 micron, or at most about 0.1 micron) thick.

Hole carrier layer 150 is generally formed of a material that at the thickness used in photovoltaic cell 100, transports holes to electrode 160 and substantially blocks the transport of electrons to electrode 160. Examples of materials from which layer 130 can be formed include polythiophenes (e.g., PEDOT), polyanilines, polycarbazoles, polyvinylcarbazoles, polyphenylenes, polyphenylvinylenes, polysilanes, polythienylenevinylenes, polyisothianaphthanenes, and copolymers thereof. In some embodiments, hole carrier layer 150 can include a dopant used in combination with one of the just-mentioned material. Examples of dopants include poly(styrene-sulfonate)s, polymeric sulfonic acids, or fluorinated polymers (e.g., fluorinated ion exchange polymers).

In some embodiments, the materials that can be used to form hole carrier layer 150 include metal oxides, such as titanium oxides, zinc oxides, tungsten oxides, molybdenum oxides, copper oxides, strontium copper oxides, or strontium titanium oxides. The metal oxides can be either undoped or doped with a dopant. Examples of dopants for metal oxides include salts or acids of fluoride, chloride, bromide, and iodide.

In some embodiments, the materials that can be used to form hole carrier layer 150 include carbon allotropes (e.g., carbon nanotubes). The carbon allotropes can be embedded in a polymer binder.

In some embodiments, the hole carrier materials can be in the form of nanoparticles. The nanoparticles can have any suitable shape, such as a spherical, cylindrical, or rod-like shape.

In some embodiments, hole carrier layer 150 can include combinations of hole carrier materials described above.

In general, the thickness of hole carrier layer 150 (i.e., the distance between the surface of hole carrier layer 150 in contact with photoactive layer 140 and the surface of electrode 160 in contact with hole carrier layer 150) can be varied as desired. Typically, the thickness of hole carrier layer 150 is at least about 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 150 is from about 0.01 micron to about 0.5 micron.

Electrode 160 is generally formed of an electrically conductive material, such as one or more of the electrically conductive materials described above with respect to electrode 120. In some embodiments, electrode 160 is formed of a combination of electrically conductive materials. In certain embodiments, electrode 160 can be formed of a mesh electrode.

Substrate 170 can be identical to or different from substrate 110. In some embodiments, substrate 170 can be formed of one or more suitable polymers, such as the polymers used in substrate 110 described above.

Figure 2:
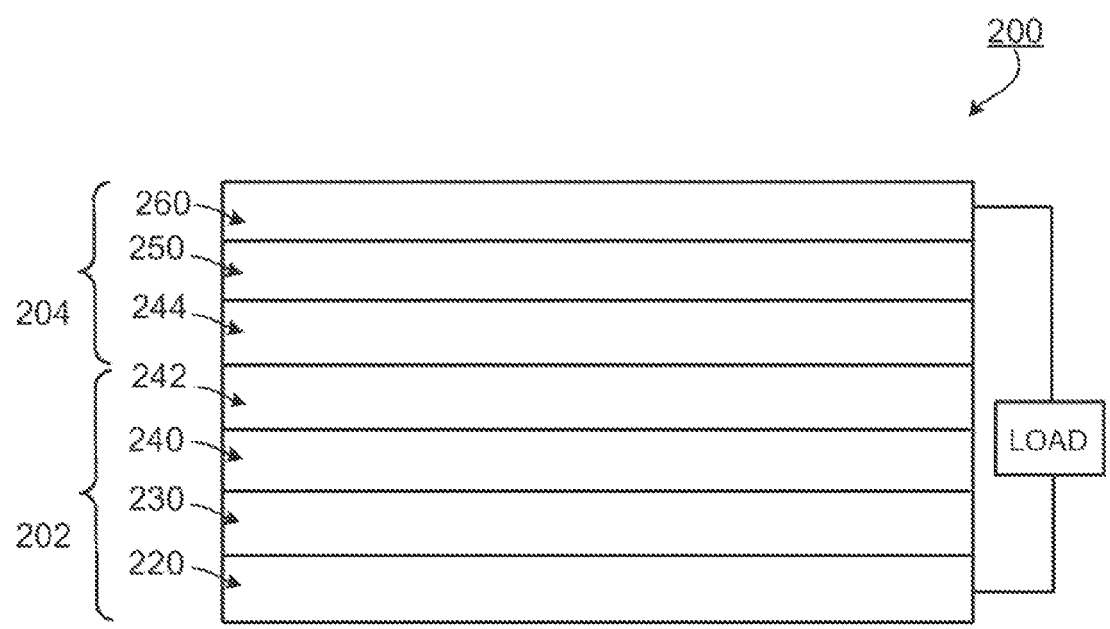
FIG. 2 is a cross-sectional view of an embodiment of a tandem photovoltaic cell.

In some embodiments, the photoactive polymers described above can be used as an electron donor material or an electron acceptor material in a system in which two photovoltaic cells share a common electrode. Such a system is also known as tandem photovoltaic cell. FIG. 2 shows a tandem photovoltaic cell 200 having two semi-cells 202 and 204. Semi-cell 202 includes an electrode 220, an optional hole blocking layer 230, a first photoactive layer 240, and a recombination layer 242. Semi-cell 204 includes recombination layer 242, a second photoactive layer 244, a hole carrier layer 250, and an electrode 260. An external load is connected to photovoltaic cell 200 via electrodes 220 and 260.

Depending on the production process and the desired device architecture, the current flow in a semi-cell can be reversed by changing the electron/hole conductivity of a certain layer (e.g., changing hole blocking layer 230 to a hole carrier layer). By doing so, the semi-cells in a tandem cell can be electrically interconnected either in series or in parallel.

A recombination layer refers to a layer in a tandem cell where the electrons generated from a first semi-cell recombine with the holes generated from a second semi-cell. Recombination layer 242 typically includes a p-type semiconductor material and an n-type semiconductor material. In general, n-type semiconductor materials selectively transport electrons and p-type semiconductor materials selectively transport holes. As a result, electrons generated from the first semi-cell recombine with holes generated from the second semi-cell at the interface of the n-type and p-type semiconductor materials.

In some embodiments, the p-type semiconductor material includes a polymer and/or a metal oxide. Examples p-type semiconductor polymers include the benzodithiophene-containing polymers described above, polythiophenes (e.g., poly (3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly (dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants include salts or acids of fluoride, chloride, bromide, and iodide. In some embodiments, the metal oxide can be used in the form of nanoparticles.

In some embodiments, the n-type semiconductor material (either an intrinsic or doped n-type semiconductor material) includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes (such as those described above), inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one-layer. In certain embodiments, recombination layer 242 includes two layers, one layer including the p-type semiconductor material and the other layer including the n-type semiconductor material. In such embodiments, recombination layer 242 can further include an electrically conductive layer (e.g., a metal layer or mixed n-type and p-type semiconductor materials) at the interface of the two layers.

In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 242 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 242 generally has a sufficient thickness so that the layers underneath are protected from any solvent applied onto recombination layer 242. In some embodiments, recombination layer 242 can have a thickness of at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 242 is substantially transparent. For example, at the thickness used in a tandem photovoltaic cell 200, recombination layer 242 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 242 generally has a sufficiently low surface resistance. In embodiments, recombination layer 242 has a surface resistance of at most about $1 \times 10^6$ ohm/square (e.g., at most about $5 \times 10^5$ ohm/square, at most about $2 \times 10^5$ ohm/square, or at most about $1 \times 10^5$ ohm/square).

Without wishing to be bound by theory, it is believed that recombination layer 242 can be considered as a common electrode between two semi-cells (e.g., one including electrode 220, hole blocking layer 230, photoactive layer 240, and recombination layer 242, and the other include recombination layer 242, photoactive layer 244, hole carrier layer 250, and electrode 260) in photovoltaic cells 200. In some embodiments, recombination layer 242 can include an electrically conductive grid (e.g., mesh) material, such as those described above. An electrically conductive grid material can provide a selective contact of the same polarity (either p-type or n-type) to the semi-cells and provide a highly conductive but transparent layer to transport electrons to a load.

In some embodiments, an one-layer recombination layer 242 can be prepared by applying a blend of an n-type semiconductor material and a p-type semiconductor material on a photoactive layer. For example, an n-type semiconductor and a p-type semiconductor can be first dispersed and/or dissolved in a solvent together to form a dispersion or solution, which can then be coated on a photoactive layer to form a recombination layer.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used as a p-type semiconductor, a polymer layer can be formed by first dissolving the polymer in a solvent (e.g., an anhydrous alcohol) to form a solution and then coating the solution on a photoactive layer.

Other components in tandem cell 200 can be formed of the same materials, or have the same characteristics, as those in photovoltaic cell 100 described above.

Other examples of tandem photovoltaic cells have been described in, e.g., commonly-owned co-pending U.S. Application Publication Nos. 2007-0181179 and 2007-0246094.

In some embodiments, the semi-cells in a tandem cell are electrically interconnected in series. When connected in series, in general, the layers can be in the order shown in FIG. 2. In certain embodiments, the semi-cells in a tandem cell are electrically interconnected in parallel. When interconnected in parallel, a tandem cell having two semi-cells can include the following layers: a first electrode, a first hole blocking layer, a first photoactive layer, a first hole carrier layer (which can serve as an electrode), a second hole carrier layer (which can serve as an electrode), a second photoactive layer, a second hole blocking layer, and a second electrode. In such embodiments, the first and second hole carrier layers can be either two separate layers or can be one single layer. In case the conductivity of the first and second hole carrier layers is not sufficient, an additional layer (e.g., an electrically conductive mesh layer such as a metal mesh layer) providing the required conductivity may be inserted.

In some embodiments, a tandem cell can include more than two semi-cells (e.g., three, four, five, six, seven, eight, nine, ten, or more semi-cells). In certain embodiments, some semi-cells can be electrically interconnected in series and some semi-cells can be electrically interconnected in parallel.

In general, the methods of preparing each layer in photovoltaic cells described in FIGS. 1 and 2 can vary as desired. In some embodiments, a layer can be prepared by a liquid-based coating process. In certain embodiments, a layer can be prepared via a gas phase-based coating process, such as chemical or physical vapor deposition processes.

The term "liquid-based coating process" mentioned herein refers to a process that uses a liquid-based coating composition. Examples of the liquid-based coating composition include solutions, dispersions, or suspensions. The liquid-based coating process can be carried out by using at least one of the following processes: solution coating, ink jet printing, spin coating, dip coating, knife coating, bar coating, spray coating, roller coating, slot coating, gravure coating, flexographic printing, or screen printing. Examples of liquid-based coating processes have been described in, for example, commonly-owned co-pending U.S. Application Publication No. 2008-0006324.

In some embodiments, when a layer includes inorganic semiconductor nanoparticles, the liquid-based coating process can be carried out by (1) mixing the nanoparticles with a solvent (e.g., an aqueous solvent or an anhydrous alcohol) to form a dispersion, (2) coating the dispersion onto a substrate, and (3) drying the coated dispersion. In certain embodiments, a liquid-based coating process for preparing a layer containing inorganic metal oxide nanoparticles can be carried out by (1) dispersing a precursor (e.g., a titanium salt) in a suitable solvent (e.g., an anhydrous alcohol) to form a dispersion, (2) coating the dispersion on a substrate, (3) hydrolyzing the dispersion to form an inorganic semiconductor nanoparticles layer (e.g., a titanium oxide nanoparticles layer), and (4) drying the inorganic semiconductor material layer. In certain embodiments, the liquid-based coating process can be carried out by a sol-gel process (e.g., by forming metal oxide nanoparticles as a sol-gel in a dispersion before coating the dispersion on a substrate).

In general, the liquid-based coating process used to prepare a layer containing an organic semiconductor material can be the same as or different from that used to prepare a layer containing an inorganic semiconductor material. In some embodiments, to prepare a layer includes an organic semiconductor material, the liquid-based coating process can be carried out by mixing the organic semiconductor material with a solvent (e.g., an organic solvent) to form a solution or a dispersion, coating the solution or dispersion on a substrate, and drying the coated solution or dispersion.

In some embodiments, the photovoltaic cells described in FIGS. 1 and 2 can be prepared in a continuous manufacturing process, such as a roll-to-roll process, thereby significantly reducing the manufacturing cost. Examples of roll-to-roll processes have been described in, for example, commonly-owned co-pending U.S. Application Publication No. 2005-0263179.

While certain embodiments have been disclosed, other embodiments are also possible.

In some embodiments, photovoltaic cell 100 includes a cathode as a bottom electrode and an anode as a top electrode. In some embodiments, photovoltaic cell 100 can include an anode as a bottom electrode and a cathode as a top electrode.

In some embodiments, photovoltaic cell 100 can include the layers shown in FIG. 1 in a reverse order. In other words, photovoltaic cell 100 can include these layers from the bottom to the top in the following sequence: a substrate 170, an electrode 160, a hole carrier layer 150, a photoactive layer 140, an optional hole blocking layer 130, an electrode 120, and a substrate 110.

In some embodiments, one of substrates 110 and 170 can be transparent. In other embodiments, both of substrates 110 and 170 can be transparent.

Figure 3:
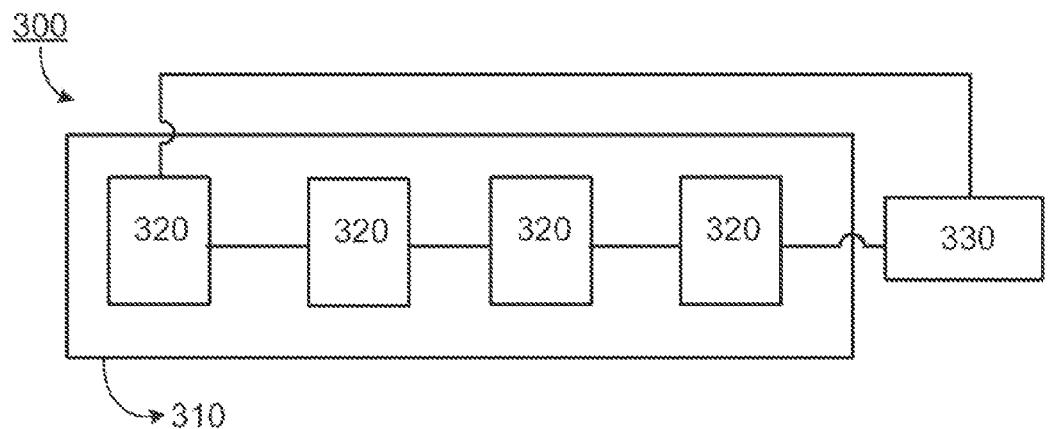
FIG. 3 is a schematic of a system containing multiple photovoltaic cells electrically connected in series.
Figure 4:
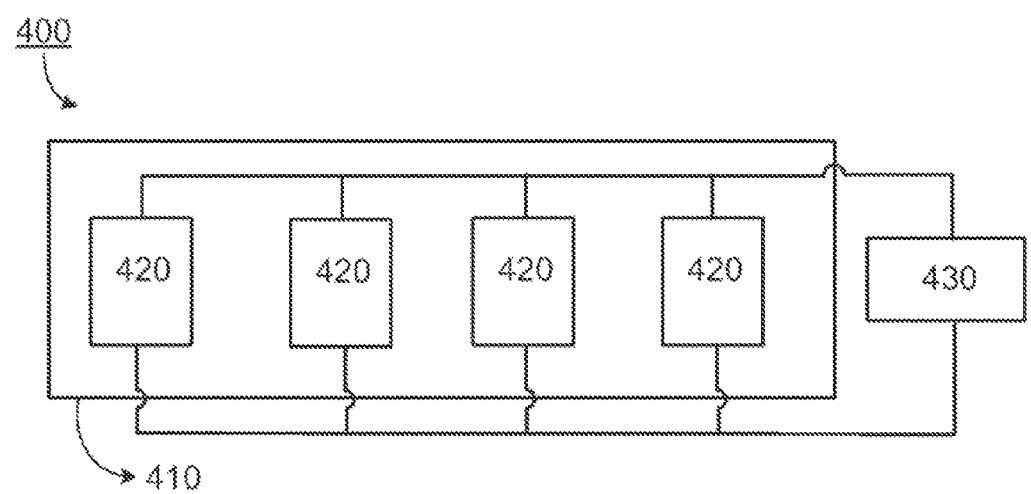
FIG. 4 is a schematic of a system containing multiple photovoltaic cells electrically connected in parallel.

In some embodiments, multiple photovoltaic cells can be electrically connected to form a photovoltaic system. As an example, FIG. 3 is a schematic of a photovoltaic system 300 having a module 310 containing a plurality of photovoltaic cells 320. Cells 320 are electrically connected in series, and system 300 is electrically connected to a load 330. As another example, FIG. 4 is a schematic of a photovoltaic system 400 having a module 410 that contains a plurality of photovoltaic cells 420. Cells 420 are electrically connected in parallel, and system 400 is electrically connected to a load 430. In some embodiments, some (e.g., all) of the photovoltaic cells in a photovoltaic system can be disposed on one or more common substrates. In certain embodiments, some photovoltaic cells in a photovoltaic system are electrically connected in series, and some of the photovoltaic cells in the photovoltaic system are electrically connected in parallel.

While organic photovoltaic cells have been described, other photovoltaic cells can also be integrated with one of the polymers described herein. Examples of such photovoltaic cells include dye sensitized photovoltaic cells and inorganic photoactive cells with a photoactive material formed of amorphous silicon, cadmium selenide, cadmium telluride, copper indium selenide, and copper indium gallium selenide. In some embodiments, a hybrid photovoltaic cell can be integrated with one of the polymers described herein.

While photovoltaic cells have been described above, in some embodiments, the polymers described herein can be used in other devices and systems. For example, the polymers can be used in suitable organic semiconductive devices, such as field effect transistors, photodetectors (e.g., IR detectors), photovoltaic detectors, imaging devices (e.g., RGB imaging devices for cameras or medical imaging systems), light emitting diodes, (LEDs) (e.g., organic LEDs (OLEDs) or IR or near IR LEDs), lasing devices, conversion layers (e.g., layers that convert visible emission into IR emission), amplifiers and emitters for telecommunication (e.g., dopants for fibers), storage elements (e.g., holographic storage elements), and electrochromic devices (e.g., electrochromic displays).

The contents of all publications cited herein (e.g., patents, patent application publications, and articles) are hereby incorporated by reference in their entirety.

The following examples are illustrative and not intended to be limiting.

Example 1

Synthesis of Polymer 1

Synthesis of 2,6-dibromo didodecyl 4,8-benzodithiophenedicarboxylate 2,6-Dibromo didodecyl 4,8-benzodithiophenedicarboxylate was synthesized based on the Scheme below.

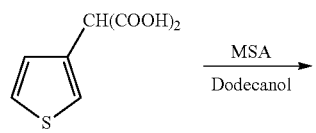

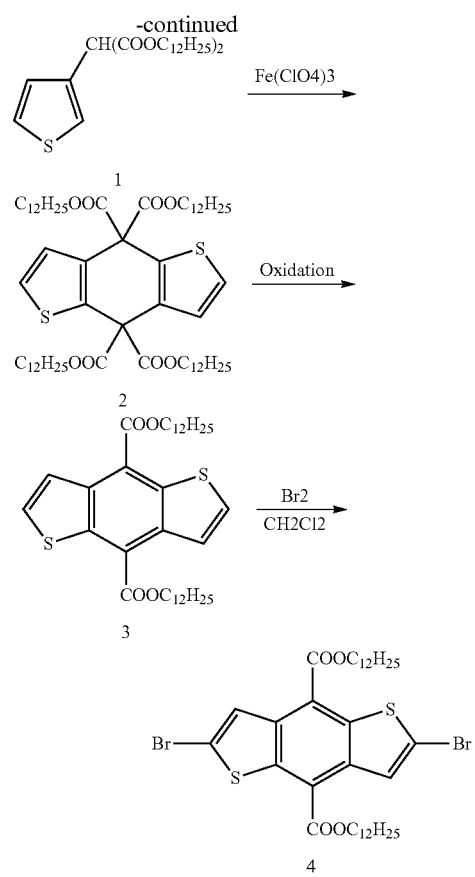

In a one-necked flask, 3-thienylmalonic acid (10.0 g, 53.7 mmol) and 1-dodecanol (4 eq., 40.0 g, 215 mmol) were dissolved in THF (80 mL) at room temperature. To this solution was added methanesulphonic acid (1.99 g, 20.7 mmol). The reaction mixture was stirred at room temperature for 3 days. The solvent was then evaporated at 40° C. The residue was re-dissolved in $CH_2Cl_2$ to form a solution, which was loaded onto a column (eluent: $CH_2Cl_2$) to give compound 1 (yield: 18.0 g, 69%). $^1$H NMR (CDCl$_3$): 0.9 (6H, t), 1.3 (36H, m), 1.7 (4H, m), 4.2 (4H, t), 4.8 (1H, s), 7.2 (1H, d), 7.3 (1H, d), 7.4 (1H, s).

In a two-necked flask under argon, a solution of Fe(ClO$_4$)$_3$ in methanol (320 mL) was prepared at 0° C. and a dispersion of compound 1 in methanol (120 mL) was added to the solution. After the resulting solution was stirred at 60° C. for 4 hours under argon, the solvent was evaporated under vacuum at room temperature. After water (100 mL) was then added to the residue, the aqueous layer was extracted with $CH_2Cl_2$ (100 mL×2) and the organic layer was dried and concentrated. The crude product was purified by flash chromatography (eluent: $CH_2Cl_2$:hexane=3:2) to give compound 2 (yield: 9.0 g, 50.2%). $^1$H NMR (CDCl$_3$); 0.9 (12H, t), 1.3 (72H, m), 1.7 (8H, m), 4.2 (8H, t), 7.3 (2H, d), 7.4 (2H, d).

In a one-necked flask, compound 2 (9.0 g, 8.65 mmol) was dispersed in DMF (80 mL). The resulting mixture was stirred at 120° C. for 10 minutes until the solution became clear. After air was purged in the flask, NaI (800 mg) was added and the reaction mixture was refluxed for 24 hours. After the solvent was evaporated under vacuum, water (30 mL) was added to the residue to form a mixture, which was extracted with $CH_2Cl_2$. The organic layer was combined, dried, and concentrated. The crude product was purified by flash chromatography (eluent: CH$_2$Cl$_2$:hexane=7:3) to give compound 3 (yield: 1.75 g, 32.9%). $^1$H NMR (CDCl$_3$): 0.9 (6H, t), 1.3 (28H, m), 1.4 (4H, m), 1.6 (4H, m), 1.9 (4H, m), 4.6 (4H, t), 7.8 (2H, d), 8.3 (2H, d).

In a two-necked flask, compound 3 (1.75 g, 2.85 mmol) was dissolved in CH$_2$Cl$_2$ (100 mL). A solution of Br$_2$ (3 eq., 1.37 g, 8.55 mmol) dissolved in 10 mL CH$_2$Cl$_2$ was added to the above dropwise. After the addition was complete, the reaction mixture was stirred at room temperature overnight. A saturated sodium bisulfate solution was then added to the reaction mixture. After the mixture was extracted with CH$_2$Cl$_2$, the organic layer was combined, dried, and concentrated. The crude product was purified by flash chromatography (eluent: hexane:CH$_2$Cl$_2$=3:2) to give compound 4, i.e., 2,6-dibromo didodecyl 4,8-benzodithiophenedicarboxylate (yield: 0.93 g, 42.3%). $^1$H NMR (CDCl$^3$): 0.9 (6H, t), 1.3 (28H, m), 1.4 (4H, m), 1.6 (4H, m) 1.9 (41-1, m), 4.6 (4H, t), 8.3 (2H, s).

Synthesis of 2,5-bis(5-bromo-3-tetradecylthiophen2-2yl)thiazolo[5,4-d]thiazole

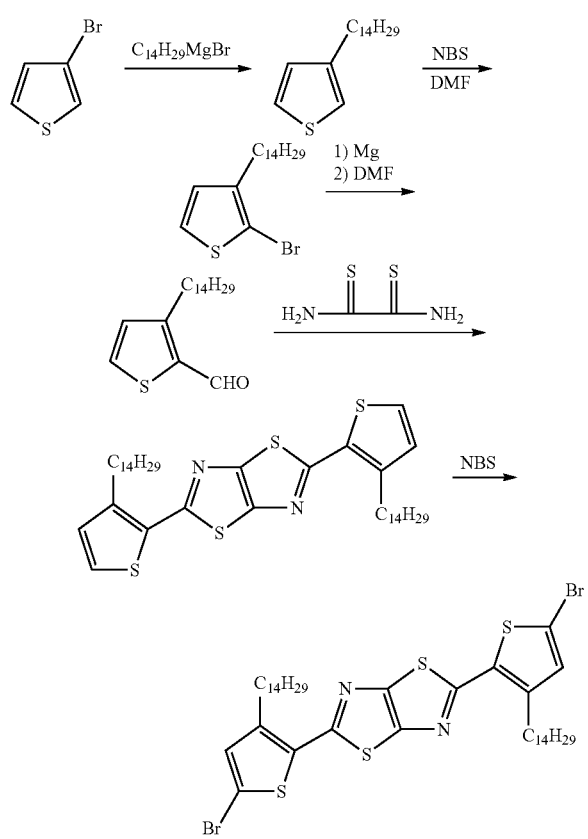

3-Tetradecylthiophene

To a mixture of 3-bromothiophene (81.5 g, 0.5 mol) and [1,3-bis(diphenylphosphino)propane]-dichloronickel(II) (dppp) in 300 mL of dry ethyl ether, tetradecylmagnesium bromide (560 mL, 0.56 mol) was added dropwise. The mixture was then refluxed overnight and cooled in an ice bath. A 5% HCl solution was added to destroy the unreacted Grignard reagents. The organic layer was separated from the water layer in a separation funnel. The ether solution was then washed with NaHCO$_3$ solution (100 mL), brine (2×100 mL), and water (100 mL) and dried over anhydrous MgSO$_4$. After the ether was removed, the organic residue was vacuum distilled (101° C./3 mmHg) to give 3-tetradecylthiophene: 85 g, yield 75.9%. 1H NMR: ä 7.23 (m, 1H), 6.93 (m, 1H), 2.62 (t, 2H), 1.64-1.26 (m, 16H), 0.88 (t, 3H).

2-Bromo-3-tetradecylthiophene

3-Tetradecylthiophene (5.6 g, 20 mmol) was dissolved in 30 mL of dry DMF. NBS (3.56 g, 20 mmol) was dissolved in 20 mL of DMF. At room temperature, the NBS solution was add to the 3-tetradecylthiophene solution dropwise. The reaction mixture was stirred in dark overnight. The reaction mixture was then poured onto ice, and then extracted with tert-butyl methyl ether (50 mL×3). The organic layer was collected and washed with half-brine (5×100 mL). After the organic layer was dried by MgSO$_4$, the solvent was removed by rotary evaporation. The organic solution thus formed was dried by vacuum pump to give 2-bromo-3-tetradecylthiophene as a colorless oil. The product was used as is in the next step without further purification.

3-Tetradecylthiophene-2-carboxaldehyde

Magnesium turnings (0.528 g, 22 mmol) dissolved and 60 mL of dry THF was placed in a 100 mL round bottom flask. 2-Bromo-3-tetradecylthiophene (7.2 g, 20 mmol) was added dropwise to above solution. The mixture was refluxed until almost all the magnesium turnings disappeared. After the mixture was transferred to a clean flask, dry DMF (4 mL) was added dropwise. The mixture was refluxed overnight and cooled in an ice bath. A 5% HCl solution (20 mL) was added to the reaction mixture. The organic portion was extracted by dichloromethane, washed by a 10% KOH solution (50 mL×3), and dried by MgSO$_4$. After removal of the solvent, the crude product was purified by column chromatography on silica gel (using 5% ethyl acetate in hexane as an eluant) to give 3-teradecylthiophene-2-carboxaldehyde as a colorless oil (yield=50%).

2,5-Bis(3-tetradecylthiophen2-2yl)thiazolo[5,4-d]thiazole

A mixture of 3-tetradecylthiophene-2-carboxaldehyde (6.2 g; 20 mmol) and dithiooxamide (0.84 g, 7 mmol) in a 50 mL round bottom flask equipped with condenser was stirred at 200° C. for 5 hours under a gentle purge of N$_2$ to drive off the water formed during the reaction. The reaction mixture was then cooled to room temperature and extracted with chloroform and water. The organic layer was dried over MgSO$_4$ and concentrated by evaporation. The brown oil thus formed was purified by column chromatography using silica gel (eluent: hexane/chloroform=5:1 v/v or 30% dichloromethane in hexane by volume) to give 3.85 g of 2,5-bis(3-tetradecylthiophen2-2yl)thiazolo[5,4-d]thiazole as yellow powder (yield=30%).

2,5-Bis(5-bromo-3-tetradecylthiophen2-2yl)thiazolo [5,4-d]thiazole

To a solution of 2,5-bis(3-tetradecylthiophen2-2yl)thiazolo[5,4-d]thiazole (5.8 g, 8.4 mmol) in 150 mL of chloroform, NBS (3.29 g, 18.5 mmol) was added in one portion and stirred under reflux for 3 hours. The reaction solution was then cooled to room temperature and washed twice with 100 mL of water. The solution was dried-over MgSO₄ and concentrated by evaporation. The resulting brown-yellow solid was washed with 100 mL of hexane at room temperature for 1 hour to afford 5.2 g of 2,5-bis(5-bromo-3-tetradecylthiophen2-2yl)thiazolo[5,4-d]thiazole as yellow powder (yield=72%). The purification may require column chromatography (using 30 vol % dichloromethane in hexane as an eluant).

Synthesis of Polymer 1

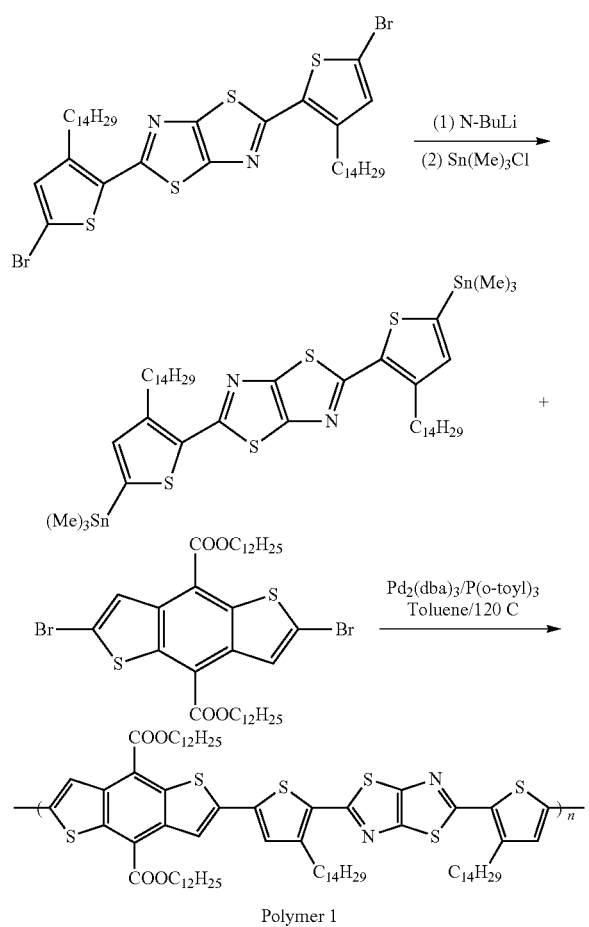

Polymer 1

2,5-Bis(5-bromo-3-tetradecylthiophen2-2yl)thiazolo[5,4-d]thiazole obtained above (2.50 g; 2.92 mmol) was placed in a two-necked flask and treated with an evacuation-argon cycle three times. After 500 mL freshly distilled THF was added via a cannula, the mixture was cooled down to −78° C. A 2.2 M solution of n-butyl-lithium in hexane (6 mL, 13.14 mmol) was then added to the above mixture dropwise at −78° C. After the solution thus obtained was stirred at −78° C. for two hours, an 1.0 M trimethyltin chloride in hexane (13.3 mL, 13.4 mmol) was added in one portion. The solution was warmed to room temperature and stirred at room temperature overnight. The reaction was then quenched by addition of water (200 mL). After the reaction solution was extracted with diethyl ether three times, the organic layer was dried over magnesium sulfate and concentrated at room temperature under high vacuum. The resulting oily product was then placed in a flask covered with an aluminum foil to protect from light. Anhydrous toluene (500 mL) was added to this product via a cannula to form a solution, which was purged with argon for 10 minutes.

2,6-Dibromo didodecyl 4,8-benzodithiophenedicarboxylate obtained above (1.98 g, 0.88 eq, 2.57 mmol), Pd₂dba₃ (2.5%, 7.3×10⁻⁵ mol, 67.6 mg), and tri-o-tolylphosphine (20%, 5.84×10⁴ mol, 178 mg) were placed in a two-necked flask and treated with an evacuation-argon cycle three times. The tin-containing compound obtained above was dissolved in toluene was added to this reaction flask via a cannula. The reaction flask was again treated with an evacuation-argon cycle three times. The reaction mixture was then refluxed for 3 days. After cooling to 60° C., an aqueous solution of sodium diethylthiocarbamate trihydrate (46 g in 900 mL water) was added to the reaction mixture, which was then stirred at 80° C. overnight. After the resulting solution was washed with water three times, the organic layer was poured into 3 L methanol to give a precipitate. The precipitated solid was subjected to sequential Soxhlet extractions with methanol (24 hours), acetone (6 hours), hexane (6 hours), dichloromethane (6 hours), chloroform (4 hours), and chlorobenzene (4 hours). The chloroform and chlorobenzene fractions were poured into methanol to form a precipitate. The resulting precipitates were dried in vacuo to give 3.3 g polymer 1 (0.4 g from the chloroform fraction and 2.9 g from the chlorobenzene fraction; total yield: 98%). Chloroform fraction: Mn=25,000 (PD1=2.20). Chlorobenzene fraction: Mn=30,000 (PD1=2.07).

Example 2

Synthesis of Polymer 2

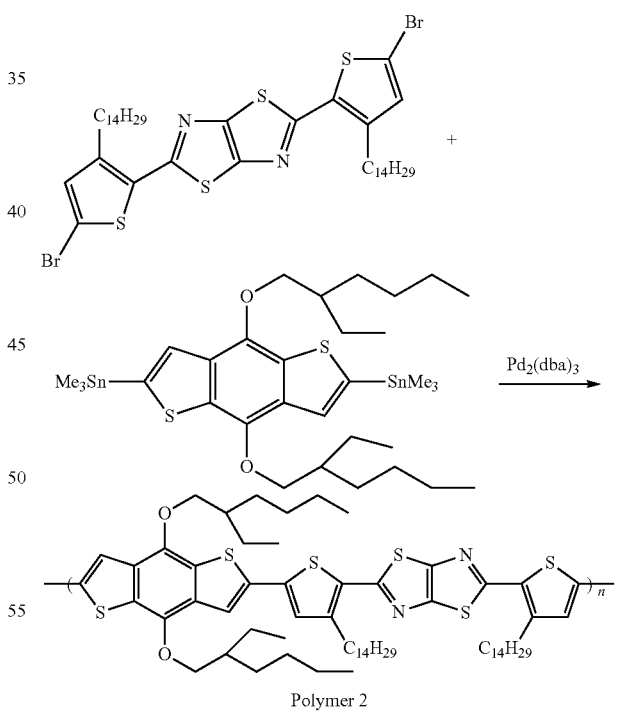

Polymer 2

To a 100 mL Schlenk flask was added 522 mg (0.61 mmol) 2,5-bis(5-bromo-3-tetradecylthiophen-2-yl)-thiazolo[5,4-d]thiazole obtained from Example 1, 557 mg (0.72 mmol) 2,6-bis(trimethyltin)-4,8-di(2-ethylhexyloxy)benzo[1,2-b;3,4-b]dithiophene (prepared according to the procedures described in Liang et al., *J. Am. Chem. Soc.*, 2009, 131, 7792), 7 mg (11 μmol) of Pd₂(dba)₃, 18 mg (59 μmol) of tri-o-tolylphosphine, and 20 mL of dry toluene. After the reaction mixture was heated to reflux for two days, it was cooled to 80° C. An aqueous solution of sodium diethyldithiocarbamate trihydrate (1.5 g in 20 mL water) was syringed into the flask and the mixture was stirred together at 80° C. for 12 hours. After the mixture was cooled to room temperature, the organic layer was separated from the aqueous layer. The organic layer was poured into methanol (200 mL) and the precipitate was collected. The precipitate was then purified by soxhlet extraction to give polymer 2, i.e., poly[(4,8-di(2-ethylhexyloxy)benzo[1,2-b;3,4-b]dithiophene,)-alt-{2,5-di(3-tetradecylthiophen-2-yl)thiazolo-[5,4-d]thiazole-5,5'-diyl}].

Examples 3 and 4

Synthesis of Polymers 3 and 4

Polymers 3 and 4 were prepared in a manner similar to that described in Example 1 using the corresponding monomers as staring materials.

Example 5

Synthesis of Polymer 5

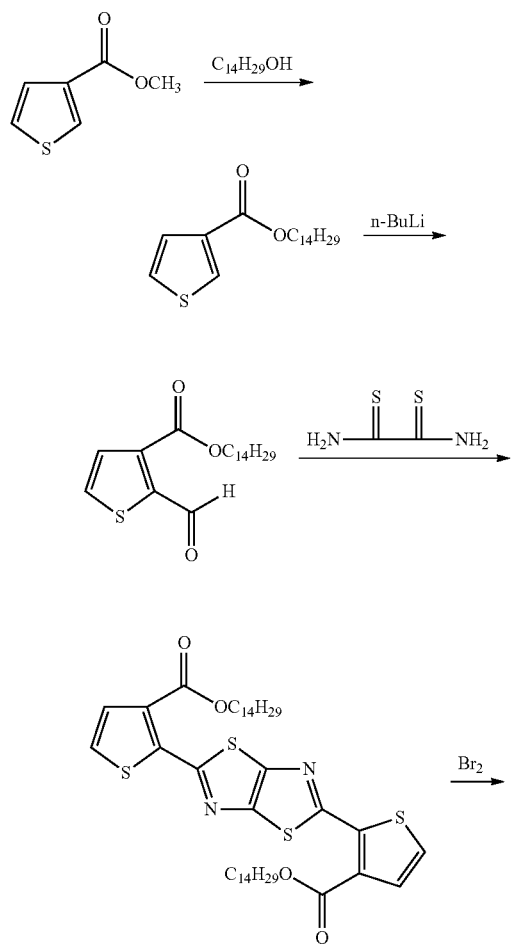

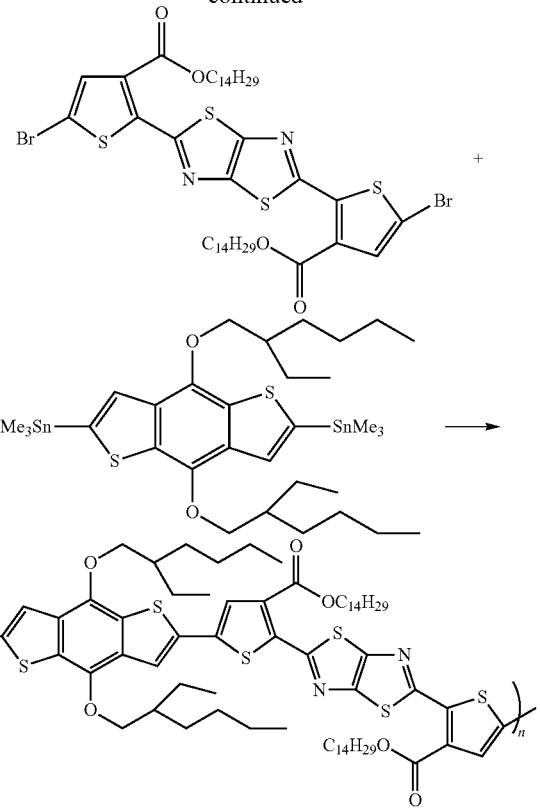

Polymer 5

Tetradecylthiophene-3-carboxylate

To a 200 mL round bottom flask were added 10 g (70 mmol) of methyl 3-thiophenecarboxylate, 17 g (79 mmol) of 1-tetradecanol, 1 mL methanesulfonic acid, and 50 mL of toluene. This mixture was heated to reflux for 17 hours. After the solvent was removed, the remaining methyl 3-thiophenecarboxylate was removed by kugelrohr distillation. The remaining residue was filtered through a silica gel pad with 10% ethyl acetate in hexane. The solvents were removed from the filtrate to provide 21 g of the desired compound. The NMR data were obtained and were consistent with those of the desired compound.

Tetradecyl-2-formylthiophene-3-carboxylate

To a 100 mL Schlenk flask were added 0.5 mL of diisopropyl amine and 20 mL of dry THF. The flask was cooled to −78° C. 3.5 mmol of n-butyl lithium in hexane was then added to the above solution. The mixture was stirred at −78° C. for 30 minutes. After stirring, 1.0 g of tetradecylthiophene-3-carboxylate in 10 mL THF was added dropwise to the solution. After stirring at −78° C. for another 2 hours, 0.7 mL of DMF was syringed into the reaction mixture. The reaction mixture was stirred for 5 h at −78° C. and 1 mL of acetic acid was added to the flask. The mixture was poured into a separation funnel and diethyl ether was added to the mixture. The organic layer was washed 3 times with 100 mL of water, dried with $MgSO_4$, and the solvents were removed by rotary evaporation. The resulting residue was purified by column chromatography using a mixture of hexane and dichloromethane to give the desired compound. The NMR data were obtained and were consistent with those of the desired compound.

2,5-Bis(3-tetradecoxycarbonyl-2-thienyl)-thiazolo[5,4-d]thiazole

To a 25 mL flask were added 0.978 g (2.8 mmol) of tetradecyl-2-formylthiophene-3-carboxylate and 110 mg (0.9 mmol) of dithiooxamide. This mixture was heated to 200° C. for 2 hours. The resulting mixture was purified by column chromatography using a mixture of hexane and dichloromethane to give the desired compound. The NMR data were obtained and were consistent with those of the desired compound.

2,5-Bis(5-bromo-3-tetradecoxycarbonyl-2-thienyl)-thiazolo[5,4-d]thiazole

To a 100 mL round bottom flask were added 200 mg (0.25 mmol) of 2,5-bis(3-tetradecoxycarbonyl-2-thienyl)-thiazolo[5,4-d]thiazole, 100 mg (0.63 mmol) of bromine and 20 mL of dichloromethane. This reaction mixture was heated to reflux for 20 hours and then cooled to room temperature. The precipitate was collected and washed with dichloromethane to give the desired compound. The NMR data were obtained and were consistent with those of the desired compound.

Poly[(4,8-di(2-ethylhexyloxy)benzo[1,2-b;3,4-]dithiophene,)-alt-{2,5-di(3-tetradecoxycarbonyl-2-thienyl)thiazolo-[5,4-d]thiazole-5,5'-diyl}] (polymer 5)

To a 100 mL Schlenk flask were added 231 mg (0.24 mmol) 2,5-bis(5-bromo-3-tetradecoxycarbonyl-2-thienyl)-thiazolo[5,4-d]thiazole, 221 mg (0.29 mmol) 2,6-bis(trimethyltin)-4,8-di(2-ethylhexyloxy)benzo[1,2-b;3,4-b]dithiophene (obtained from Example 2 above), 7 mg (7 μmol) of Pd$_2$(dba)$_3$, 18 mg (59 μmol) of tri-o-tolylphosphine and 20 mL of dry toluene. After the reaction mixture was heated to reflux for two days, it was cooled to 80° C. An aqueous solution of sodium diethyldithiocarbamate trihydrate (1.5 g in 20 mL water) was syringed into the flask and the mixture was stirred at 80° C. for 12 hours. The mixture was cooled to room temperature and the organic phase was separated from the aqueous layer. The organic layer was poured into methanol (200 mL) and the precipitate was collected. The precipitate was then purified by soxhlet extraction to give polymer 5.

Example 6

Synthesis of Polymer 6

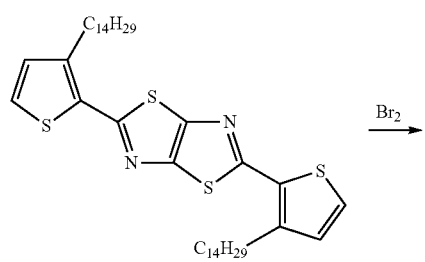

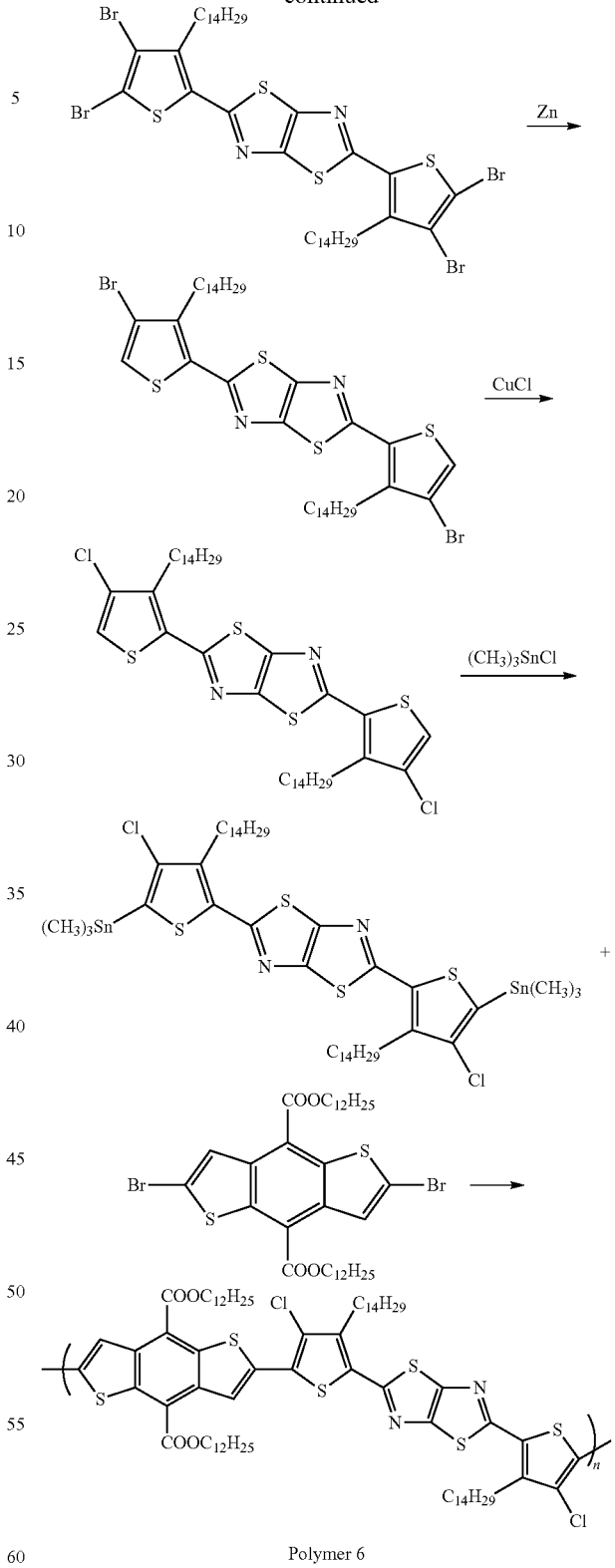

2,5-Bis(5,4-Dibromo-3-tetradecyl-2-thienyl)-thiazolo[5,4-d]thiazole

To a 50 mL round bottom flask were added to 0.915 g of 2,5-bis(3-tetradecyl-2-thienyl)-thiazolo[5,4-d]thiazole 20 mL of dichloromethane, and 1 mL of bromine. The flask was heated to reflux for 16 hours and then cooled to room temperature. The precipitate was collected and washed with dichloromethane to give the desired compound. The NMR data were obtained and were consistent with those of the desired compound.

2,5-Bis(4-bromo-3-tetradecyl-2-thienyl)-thiazolo[5,4-d]thiazole

To a 50 mL round bottom flask were added to 0.800 g of 2,5-bis(5,4 dibromo-3-tetradecyl-2-thienyl)-thiazolo[5,4-d]thiazole, 0.500 g Zn dust, 3 mL 3 M HCl, 2 mL acetic acid, 15 mL ethanol, and 15 mL toluene. The flask was heated to 100° C. for 3 hours. The reaction mixture was then filtered and the solvents were removed by rotary evaporation. The residue was purified by column chromatography using a mixture of hexane and dichloromethane to give the desired compound. The NMR data were obtained and were consistent with those of the desired compound.

2,5-Bis(4-chloro-3-tetradecyl-2-thienyl)-thiazolo[5,4-d]thiazole

To a 50 mL round bottom flask were added to 0.200 g of 2,5-bis(4-bromo-3-tetradecyl-2-thienyl)-thiazolo[5,4-d]thiazole, 0.260 g of CuCl, and 20 mL of dimethylformamide. The flask was purged with argon and then heated to 130° C. for 17 hours. To the reaction flask was added 50 mL of diethyl ether. This mixture was subsequently washed 3 times with 100 mL of water and dried with MgSO$_4$. The solvents were removed by rotary evaporation. The residue was purified by column chromatography using a mixture of hexane and dichloromethane to give the desired compound. The NMR data were obtained and were consistent with those of the desired compound.

2,5-Bis(5-trimethylstannyl-4-chloro-3-tetradecyl-2-thienyl)-thiazolo[5,4-d]thiazole To a 100 mL Schlenk flask was added 250 mg (0.32 mmol) of 2,5-bis(4-chloro-3-tetradecyl-2-thienyl)-thiazolo[5,4-d]thiazole. The flask was evacuated and refilled with argon three times. After 35 mL of dry THF was added to the flask, the flask was cooled to −78° C. n-Butyl lithium (0.96 mmol) was then added dropwise to the solution. After stirring at −78° C. for 1 hour, 1.1 mL of an 1.0 M solution of trimethyltin chloride was syringed into the reaction mixture. After the solution was allowed to warm up to room temperature, 100 mL of diethyl ether was added to the solution. The solution was washed three times with 100 mL of water and then the organic layer was dried MgSO$_4$. The solvent was removed in vacuo and the desired compound, i.e., 2,5-bis(5-trimethylstannyl-4-chloro-3-tetradecyl-2-thienyl)-thiazolo[5,4-d]thiazole, was isolated in quantitative yield. The NMR data were obtained and were consistent with those of the desired compound.

Poly[(4,8-benzo[1,2-b:4,5-b']dithiophenedicarboxylic acid dodecyl ester)-alt-{2,5-di(4-chloro-3-tetradecylthiophen-2-yl)thiazolo-[5,4-d]thiazole-5,5'-diyl}] (polymer 6)

To a 100 mL three neck round bottom flask were added 0.620 g (0.56 mmol) 2,5-bis(5-trimethylstannyl-4-chloro-3-tetradecyl-2-thienyl)-thiazolo[5,4-d]thiazole, 7 mg (7 µmol) of Pd$_2$(dba)$_3$, 18 mg (59 µmol) of tri-o-tolylphosphine, 375 mg (0.49 mmol) of 2,6-dibromo-4,8-benzo[1,2-b:4,5-b']dithiophenedicarboxylic acid dodecyl ester (obtained from Example 1 above) and 20 mL of dry toluene. This reaction mixture was heated to reflux for two days and then cooled to 80° C. After an aqueous solution of sodium diethyldithiocarbamate trihydrate (1.5 g in 20 mL water) was syringed into the flask, the mixture was stirred together at 80° C. for 12 hours. The mixture was cooled to room temperature and the organic phase was separated from the aqueous layer. The organic layer was poured into methanol (200 mL) and the precipitate was collected. The precipitate was then purified by soxhlet extraction to give polymer 6.

Example 7

Synthesis of Polymer 7

Polymer 7 was prepared in a manner similar to that described in Example 1 using the corresponding monomers as staring materials.

Example 8

Synthesis of Polymer 8

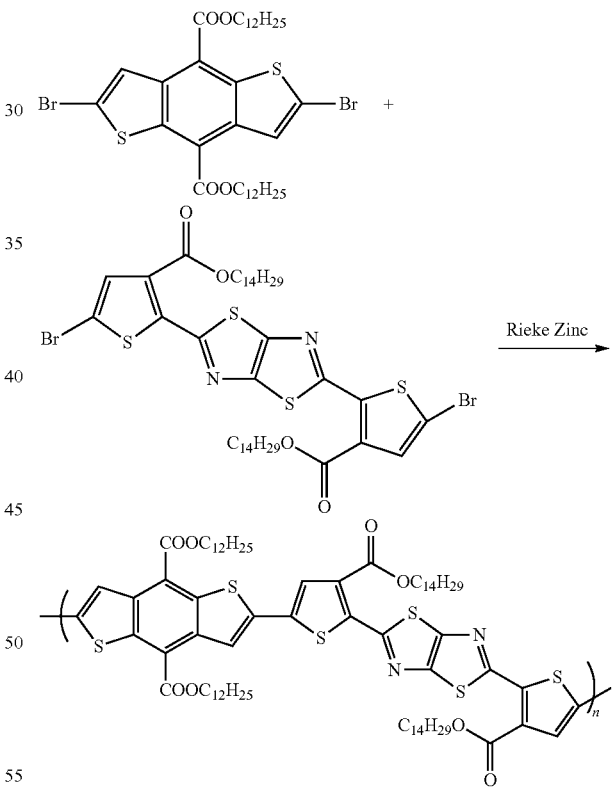

Polymer 8

Poly[(4,8-benzo[1,2-b:4,5-b']dithiophenedicarboxylic acid dodecyl ester)-alt-{2,5-di(3-tetradecoxycarbonyl-2-thienyl)thiazolo-[5,4-d]thiazole-5,5'-diyl}] (polymer 8)

To a 100 mL Schlenk flask were added 203 mg (0.21 mmol) 2,5-bis(5-bromo-3-tetradecoxycarbonyl-2-thienyl)-thiazolo[5,4-d]thiazole (obtained from Example 5 above) and 20 mL of THF. 15 mL Rieke zinc solution (5 g in 100 mL of THF) was then added to the Schlenk flask. The reaction mixture was refluxed for 1 hour and then cooled to room temperature. The reaction mixture was filtered to remove the remaining unreacted zinc. To the filtered zinc reagent solution were added 129 mg (0.17 mmol) 2,6-dibromo-4,8-benzo[1,2-b:4,5-b'] dithiophenedicarboxylic acid dodecyl ester (obtained from Example 1 above) and 7 mg (7 μmol) of $Pd_2(dba)_3$, 24 mg (59 μmol) of 2-dicyclohexylphosphino-2',6'-dimethoxybiphenyl. This reaction mixture was heated to reflux for two days and then it was cooled to 80° C. An aqueous solution of sodium diethyldithiocarbamate trihydrate (1.5 g in 20 mL water) was syringed into the flask and the mixture was stirred together at 80° C. for 12 hours. The mixture was cooled to room temperature and the organic phase was separated from the aqueous layer. The organic layer was poured into methanol (200 mL) and the precipitate was collected. The precipitate was then purified by soxhlet extraction to give polymer 8.

Example 9

Synthesis of Polymer 9

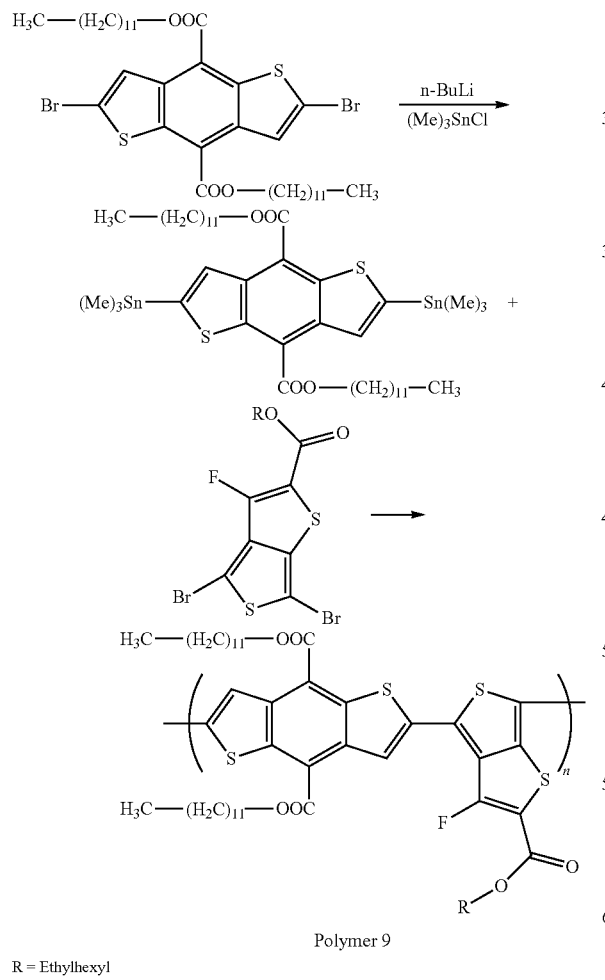

Polymer 9

R = Ethylhexyl 2,6-Dibromo-4,8-benzo[1,2-b:4,5-b]dithiophenedicarboxylic acid dodecyl ester (266 g, 344 mmol) (obtained from Example 1 above) was place in a two-necked flask and was treated with evacuation-argon cycle three times. 50 mL freshly distilled THF via a cannula was added to the above flask and cooled down to −78° C. A 2.85 M solution of n-butyl-lithium in hexane (361 mL, 3 eq., 1.03 mmol) was added dropwise at −78° C. After the solution was stirred at −78° C. for one hour, 1.0 M trimethyltin chloride in hexane (1.20 mL, 1.20 mmol) was added in one portion. The solution was warmed to room temperature and was stirred at room temperature for two hours. The reaction was quenched by addition of water (50 mL). After the reaction solution was extracted with diethyl ether (three times), the organic layer was washed with a brine solution, dried over anhydrous magnesium sulfate, and concentrated at room temperature under high vacuum. The crude product was purified by a short path column chromatography (eluent: 40% dichloromethane in hexane) to give the pure product 2,6-bis-trimethylstannanyl-4,8-benzo[1,2-b:4,5-b]dithiophenedicarboxylic acid didodecyl ester as a pale yellow solid (200 mg; 65% yield). The structure of the product was confirmed by NMR.

2,6-bis-trimethylstannanyl-4,8-benzo[1,2-b:4,5-b] dithiophenedicarboxylic acid didodecyl ester (155 mg, 0.165 mmol) obtained above, 4,6-dibromo-3-fluoro-thieno[3,4-b] thiophene-2-carboxylic acid 2-ethyl-hexyl ester (70.8 mg, 0.15 mmol) prepared according to the procedures described in Liang et al., Advanced Materials, 2010, 22(20), E135-E138, tris(dibenzylideneacetone)-dipalladium(0) ($Pd_2(dba)_3$) (6 mg, 0.006 mmol) and tri(o-tolyl)phosphine (15.4 mg, 0.05 mmol) were dissolved in dry degassed toluene (20 mL) under argon. The solution was deoxygenated by bubbling argon for 30 minutes. The mixture was vigorously stirred at 120° C. for 24 hours under argon. The reaction mixture was then stirred with a solution of sodium diethyldithiocarbamate trihydrate (2.5 g) in distilled water (25 mL) at 80° C. for 24 hours. The organic phase was separated, washed three times with water, and was poured into methanol (100 mL). The precipitate was collected, washed with methanol, and Soxhlet-extracted with acetone and hexane. The dark blue polymer remaining in the thimble was collected and dried under vacuum to give polymer 9. UV λmax (1,2-dichlorobenzene): 669 nm, 319 nm.

Examples 10-22

Synthesis of Polymers 10-22

Polymers 10-22 were, prepared in a manner similar to that described in Example 1 using the corresponding monomers as staring materials.

Example 23

Synthesis of Polymer 23

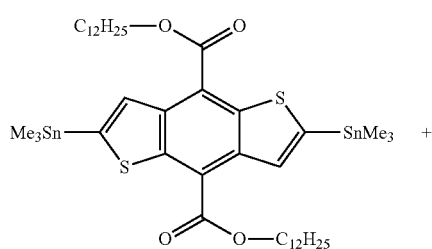

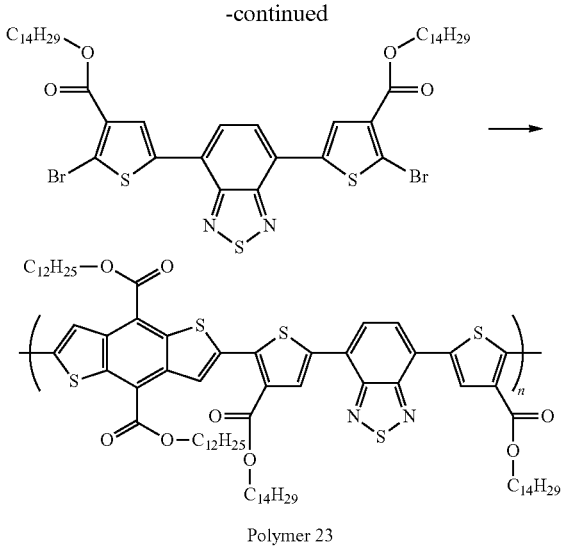

Polymer 23

2,6-bis-trimethylstannanyl-4,8-benzo[1,2-b:4,5-b]dithiophenedicarboxylic acid didodecyl ester (103 mg, 0.11 mmol) obtained from Example 9 above, bis(tetradecyl)-5,5'-(benzo[c][1,2,5]thiadiazole-4,7-diyl)bis(2-bromothiophene-3-carboxylate)(94 mg, 0.1 mmol) prepared according to the procedures described in Helgesen et al., *Chem. Mater.*, 2010, 22(19), 5617-5624, tris(dibenzylideneacetone)dipalladium (0) ($Pd_2(dba)_3$) (4 mg, 0.004 mmol) and tri(o-tolyl)phosphine (10.3 mg, 0.033 mmol) were dissolved in dry degassed toluene (10 mL) under argon. The solution was deoxygenated by bubbling argon for 30 minutes. The mixture was vigorously stirred at 120° C. for 96 hours under argon. The reaction mixture was then stirred with a solution of sodium diethyldithiocarbamate trihydrate (1.5 g) in distilled water (15 mL) at 80° C. for 24 hours. The organic phase was separated and washed three times with water and was poured into methanol (75 mL). The precipitate was collected and Soxhlet-extracted with acetone and methylene chloride. The purplish blue polymer remaining in the thimble was collected and dried under vacuum to give polymer 23 (119 mg, 85%). UV λmax (1,2-dichlorobenzene): 562 nm.

Example 24

Synthesis of Polymer 24

Polymer 24 was prepared in a manner similar to that described in Example 1 using the corresponding monomers as staring materials.

Example 25

Fabrication of Photovoltaic Cells

Photoactive polymers 1, 19, and 22 were used to fabricate inverted organic photovoltaic cells containing a glass substrate with a transparent pre-patterned indium tin oxide (ITO) bottom electrode, a hole blocking layer on top of the ITO electrode, a photoactive layer on top of the hole blocking layer, a hole carrier layer on top of the photoactive layer, and a top silver electrode. The hole blocking layer contained $TiO_x$ and the hole carrier layer contained a thiophene polymer in the HIL family available from Air Products and Chemicals, Inc. The photoactive layer was formed from a blend of a photoactive polymer and PCBM (1:2 by weight) dissolved in 1,2-dichlorobenzene at a concentration of 0.6% by weight and stirred at 80° C. for at least 12 hours before coating by using a blade-coating technique. During the blade-coating process, the solution was kept under stirring at 80° C. while the blade-coater temperature was maintained at 50° C. The thickness of the photoactive layer was adjusted by the blade speed and the volume of solution deposited.

The current density-voltage characteristics of the above photovoltaic cells were measured as described in Waldauf et al., *Appl. Phys. Lett.* 89, 233517 (2006). The results are summarized in Table 1 below.

TABLE 1

| | Conversion Efficiency (%) | Fill Factor (%) | Open-Circuit Voltage (mV) | Short-Circuit Current (mA/cm²) |
|---|---|---|---|---|
| Polymer 1 | 5.30 | 59 | 770 | 11.66 |
| Polymer 19 | 1.14 | 63 | 700 | 2.52 |
| Polymer 22 | 0.58 | 59 | 500 | 1.96 |

Other embodiments are in the claims.

What is claimed is:

1. An article, comprising:
   a first electrode,
   a second electrode, and
   a photoactive material disposed between the first and second electrodes, the photoactive material comprising a polymer including a first monomer repeat unit, the first monomer repeat unit comprising a benzodithiophene moiety substituted with at least one electron withdrawing group selected from COR, COOR, CO—N(RR'), $C_1$-$C_{20}$ perfluoroalkyl, or $SO_3R$, in which each of R or R', independently, is H, $C_1$-$C_{24}$ alkyl, aryl, heteroaryl, $C_3$-$C_{24}$ cycloalkyl, or $C_3$-$C_{24}$ heterocycloalkyl;
   wherein the article is configured as a photovoltaic cell.

2. The article of claim 1, wherein the electron withdrawing group is $COOC_8H_{17}$, $COOC_{10}H_{21}$, $COOC_{12}H_{25}$, $COOC_{14}H_{29}$, $COOC_{16}H_{33}$, CO—$N(C_4H_9)_2$, or CO—N$(C_8H_{17})_2$.

3. The article of claim 1, wherein the benzodithiophene moiety is substituted with two electron withdrawing groups.

4. The article of claim 1, wherein the first monomer repeat unit comprises a benzodithiophene moiety of formula (1):

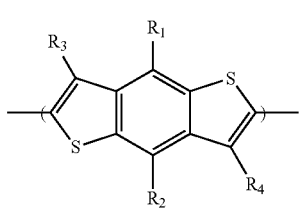

(1)

in which each of $R_1$ and $R_2$, independently, is H or an electron withdrawing group, and each of $R_3$ and $R_4$, independently, is H, halo, $C_1$-$C_{24}$ alkyl, $C_1$-$C_{24}$ alkoxy, aryl, heteroaryl, $C_3$-$C_{24}$ cycloalkyl, $C_3$-$C_{24}$ heterocycloalkyl, COR", or COOR", in which R" is H, $C_1$-$C_{24}$ alkyl, aryl, heteroaryl, $C_3$-$C_{24}$ cycloalkyl, or $C_3$-$C_{24}$ heterocycloalkyl.

5. The article of claim 4, wherein each of $R_1$ and $R_2$, independently, is COR, COOR, CO—N(RR'), $C_1$-$C_{20}$ perfluoroalkyl, CN, or SO$_3$R, in which each of R or R', independently, is H, C$_1$-C$_{24}$ alkyl, aryl, heteroaryl, C$_3$-C$_{24}$ cycloalkyl, or C$_3$-C$_{24}$ heterocycloalkyl.

6. The article of claim 5, wherein the first monomer repeat unit comprises a benzodithiophene moiety of formula (1), in which each of R$_1$ and R$_2$, independently, is COR, COOR, or CO—N(RR').

7. The article of claim 6, wherein each of R$_1$ and R$_2$ is COOC$_8$H$_{17}$, COOC$_{10}$H$_{21}$, COOC$_{12}$H$_{25}$, COOC$_{14}$H$_{29}$, COOC$_{16}$H$_{33}$, CO—N(C$_4$H$_9$)$_2$, or CO—N(C$_8$H$_{17}$)$_2$, and each of R$_3$ and R$_4$ is H.

8. The article of claim 1, wherein the polymer further comprises a second monomer repeat unit different from the first monomer repeat unit.

9. The article of claim 8, wherein the second monomer repeat unit comprises a benzothiadiazole moiety.

10. The article of claim 9, wherein the second monomer repeat unit comprises a benzothiadiazole moiety of formula (4):

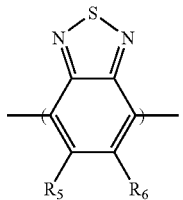

(4)

wherein
each of X and Y, independently, is CH$_2$, O, or S;
each of R$_1$ and R$_2$, independently, is H, COR, COOR, CO—N(RR'), C$_1$-C$_{20}$ perfluoroalkyl, CN, or SO$_3$R, in which each of R or R', independently, is H, C$_1$-C$_{24}$ alkyl, aryl, heteroaryl, C$_3$-C$_{24}$ cycloalkyl, or C$_3$-C$_{24}$ heterocycloalkyl; and
each of R$_3$, R$_4$, R$_5$, R$_6$, R$_7$, and R$_8$, independently, is H, halo, C$_1$-C$_{24}$ alkyl, C$_1$-C$_{24}$ alkoxy, aryl, heteroaryl, C$_3$-C$_{24}$ cycloalkyl, C$_3$-C$_{24}$ heterocycloalkyl, COR", or COOR", in which R" is H, C$_1$-C$_{24}$ alkyl, aryl, heteroaryl, C$_3$-C$_{24}$ cycloalkyl, or C$_3$-C$_{24}$ heterocycloalkyl.

11. The article of claim 10, wherein the second monomer repeat unit comprises a benzothiadiazole moiety of formula (4).

12. The article of claim 10, wherein the polymer further comprises a third monomer repeat unit different from the first and second monomer repeat units.

13. The article of claim 12, wherein the third monomer repeat unit comprises a thiazole moiety or a thiophene moiety.

14. The article of claim 13, wherein the third monomer repeat unit comprise a thiazole moiety of formula (18) or a thiophene moiety of formula (24):

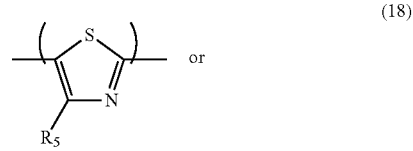

(18)

(24)

in which each of R$_5$ and R$_6$, independently, is H, halo, C$_1$-C$_{24}$ alkyl, C$_1$-C$_{24}$ alkoxy, aryl, heteroaryl, C$_3$-C$_{24}$ cycloalkyl, C$_3$-C$_{24}$ heterocycloalkyl, COR", or COOR", in which R" is H, C$_1$-C$_{24}$ alkyl, aryl, heteroaryl, C$_3$-C$_{24}$ cycloalkyl, or C$_3$-C$_{24}$ heterocycloalkyl.

15. The article of claim 14, wherein R$_5$ is H, C$_1$-C$_{24}$ alkyl, COR", or COOR", and R$_6$ is H or halo.

16. The article of claim 15, wherein R$_5$ is H, Cl, C$_6$H$_{13}$, C$_8$H$_{17}$, C$_{14}$H$_{29}$, COOC$_6$H$_{13}$, COC$_{13}$H$_{27}$, or COOC$_{14}$H$_{29}$, and R$_6$ is H or Cl.

* * * * *